United States Patent [19]
Williams

[11] Patent Number: 5,872,457
[45] Date of Patent: *Feb. 16, 1999

[54] METHOD AND APPARATUS FOR SEPARATING AND ANALYZING COMPOSITE AC/DC WAVEFORMS

[75] Inventor: Harold Richard Williams, Columbus, Ohio

[73] Assignee: ADB-Alnaco, Inc., Columbus, Ohio

[ * ] Notice: The term of this patent shall not extend beyond the expiration date of Pat. No. 5,638,057.

[21] Appl. No.: 611,963

[22] Filed: Mar. 7, 1996

Related U.S. Application Data

[62] Division of Ser. No. 239,812, May 9, 1994, Pat. No. 5,648,723.

[51] Int. Cl.$^6$ ................................................. G01R 27/26
[52] U.S. Cl. .......................... 324/654; 324/509; 340/694; 340/950
[58] Field of Search ............................ 324/509, 510, 324/654; 340/642, 953, 950, 949, 955

[56] References Cited

U.S. PATENT DOCUMENTS

| | | |
|---|---|---|
| 3,771,120 | 11/1973 | Bonazoli et al. . |
| 3,819,980 | 6/1974 | Mullersman . |
| 3,829,735 | 8/1974 | Berlock et al. . |
| 3,943,339 | 3/1976 | Koerner et al. ........................ 340/939 |
| 4,216,413 | 8/1980 | Plas . |
| 4,242,614 | 12/1980 | Vatis et al. . |
| 4,295,079 | 10/1981 | Otsuka et al. . |
| 4,297,632 | 10/1981 | Glaser et al. . |
| 4,330,778 | 5/1982 | Yamazaki et al. . |
| 4,363,105 | 12/1982 | Plassmeier . |
| 4,396,868 | 8/1983 | Watanabe et al. . |
| 4,418,333 | 11/1983 | Schwarzbach . |
| 4,449,073 | 5/1984 | Mongoven et al. . |
| 4,466,071 | 8/1984 | Russell, Jr. . |
| 4,481,516 | 11/1984 | Michelotti . |
| 4,590,471 | 5/1986 | Pieroway et al. . |
| 4,646,088 | 2/1987 | Inoue . |
| 4,675,574 | 6/1987 | Delflache ................................ 340/642 |
| 4,901,257 | 2/1990 | Chang et al. ........................... 364/557 |

(List continued on next page.)

FOREIGN PATENT DOCUMENTS

| | | |
|---|---|---|
| 0 284 592 | 9/1988 | European Pat. Off. . |
| 0 437 214 A2 | 7/1991 | European Pat. Off. . |
| 470324 | 1/1929 | Germany . |
| 2 931 445 B1 | 10/1980 | Germany . |
| 4 109 586 A1 | 10/1992 | Germany . |
| 58-189565 | 11/1983 | Japan ..................................... 324/509 |
| 367430 | 2/1932 | United Kingdom . |
| 568622 | 4/1945 | United Kingdom . |
| 1 057 401 | 2/1967 | United Kingdom ................... 340/953 |
| 1424802 | 2/1976 | United Kingdom . |
| 2 174 852 | 11/1986 | United Kingdom . |
| PCT/SE89/ 00546 | 9/1989 | WIPO . |

OTHER PUBLICATIONS

"Automatic Monitoring System for the CCR and Aerodrome Lighting System on Airport System"; Nobuyuki Matsunaga, Yorio Hosokawa and Osafumi Takemoto, 1980. (no month).
"A New System For Selective Control of Taxiway Lights"; Goran Eriksson, 1988. (no month).
"The Swedish Approach To An SMGC System"; Gorn Eriksson, Jul. 29, 1989.
Engineering and Automation, vol. 14, No. 3/04. May 1, 1992, pp. 24–27, H. Kieswalter, "Operations Monitoring System For Safe Airport Lighting".
European search Report for EP 95 115887.
European Search Report for EP 95 115888.

Primary Examiner—Maura Regan

[57] ABSTRACT

The present invention includes a method for separating AC and DC components of a composite waveform, and an inductive device capable of performing the method. The present invention also includes a ground fault condition monitoring system containing an inductive device of the present invention, and an electrical distribution system containing such a ground fault condition monitoring system, such as one for a lighting system.

10 Claims, 26 Drawing Sheets

U.S. PATENT DOCUMENTS

| | | | |
|---|---|---|---|
| 4,939,505 | 7/1990 | Cappellini et al. | |
| 4,951,046 | 8/1990 | Lambert et al. | |
| 4,980,645 | 12/1990 | Soma et al. | 324/544 |
| 5,075,628 | 12/1991 | Schuster et al. | 324/509 |
| 5,220,321 | 6/1993 | Sauer | 349/642 |
| 5,239,236 | 8/1993 | Backstrom et al. | |
| 5,243,340 | 9/1993 | Norman et al. | 340/642 |
| 5,276,401 | 1/1994 | Soma et al. | 324/544 |
| 5,485,151 | 1/1996 | Runyon et al. | 340/642 |

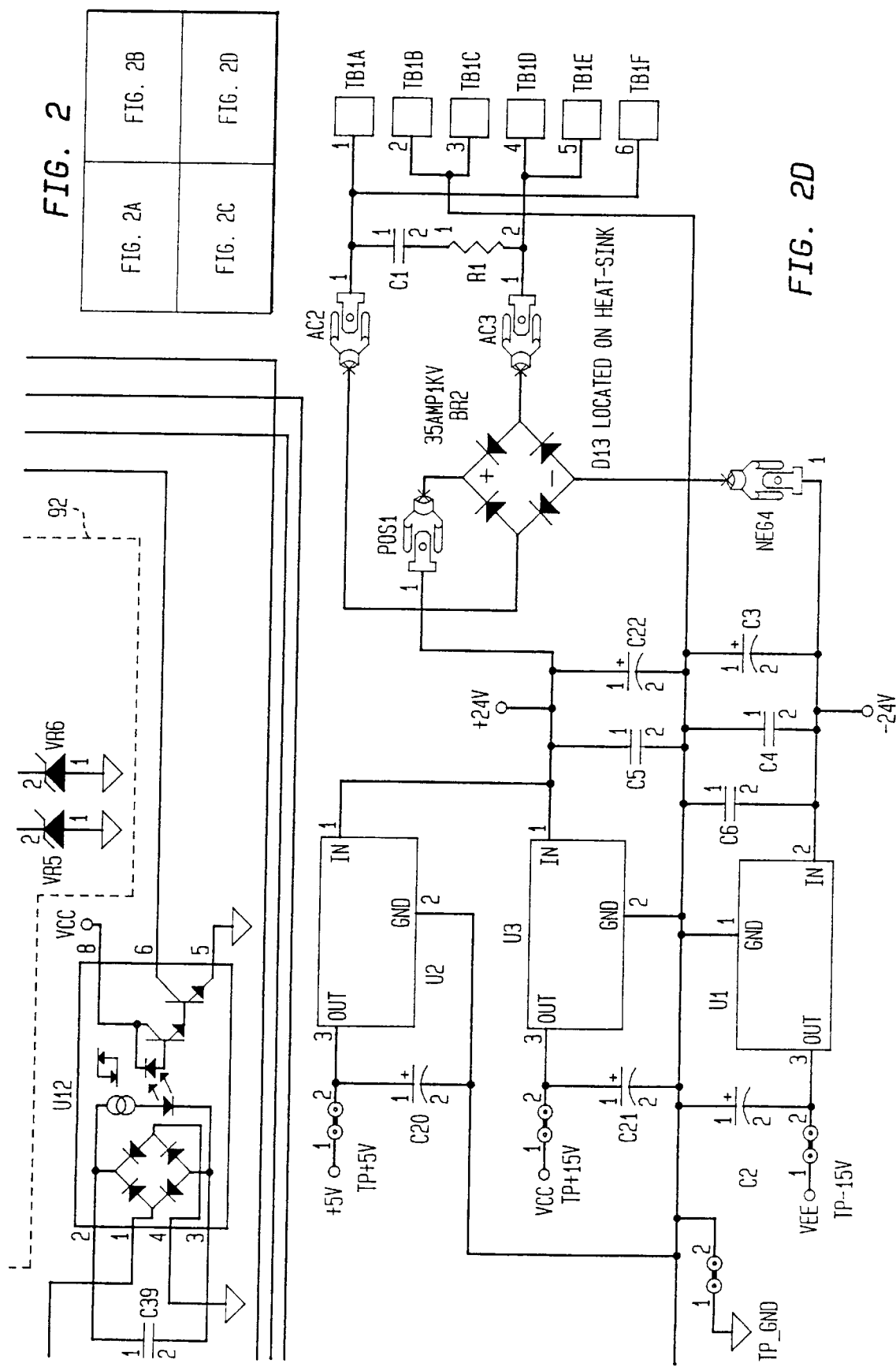

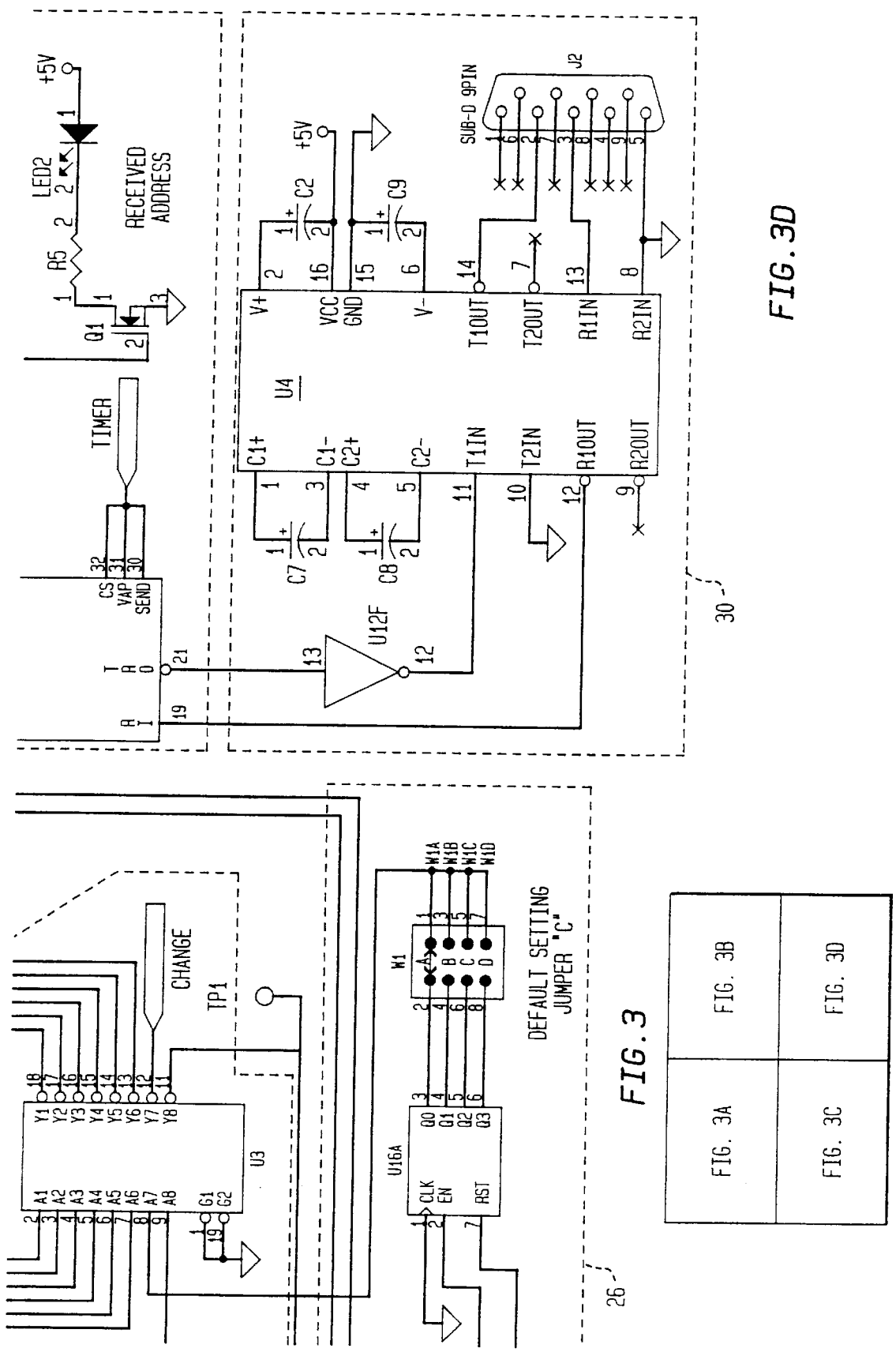

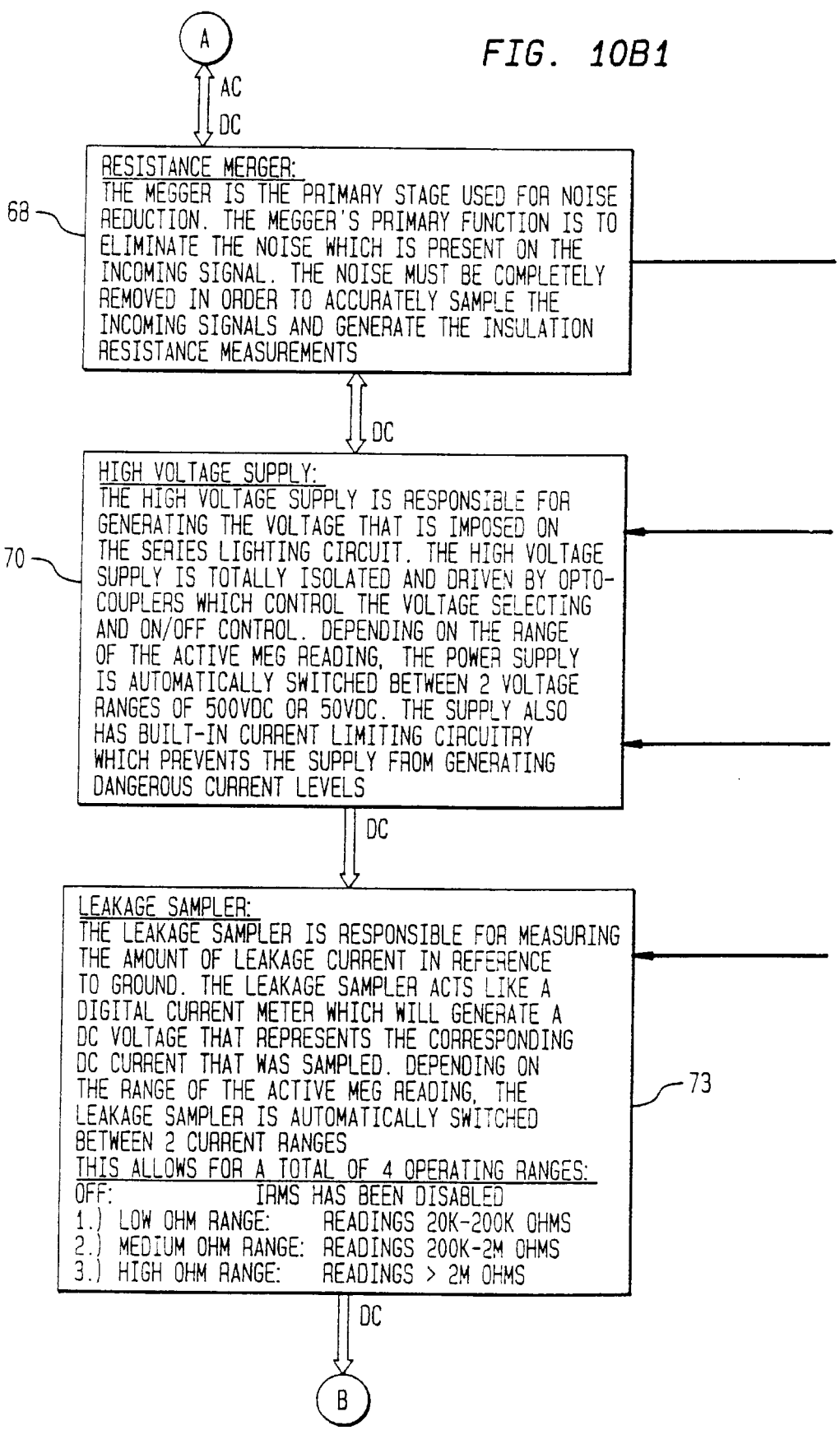
FIG. 10B1

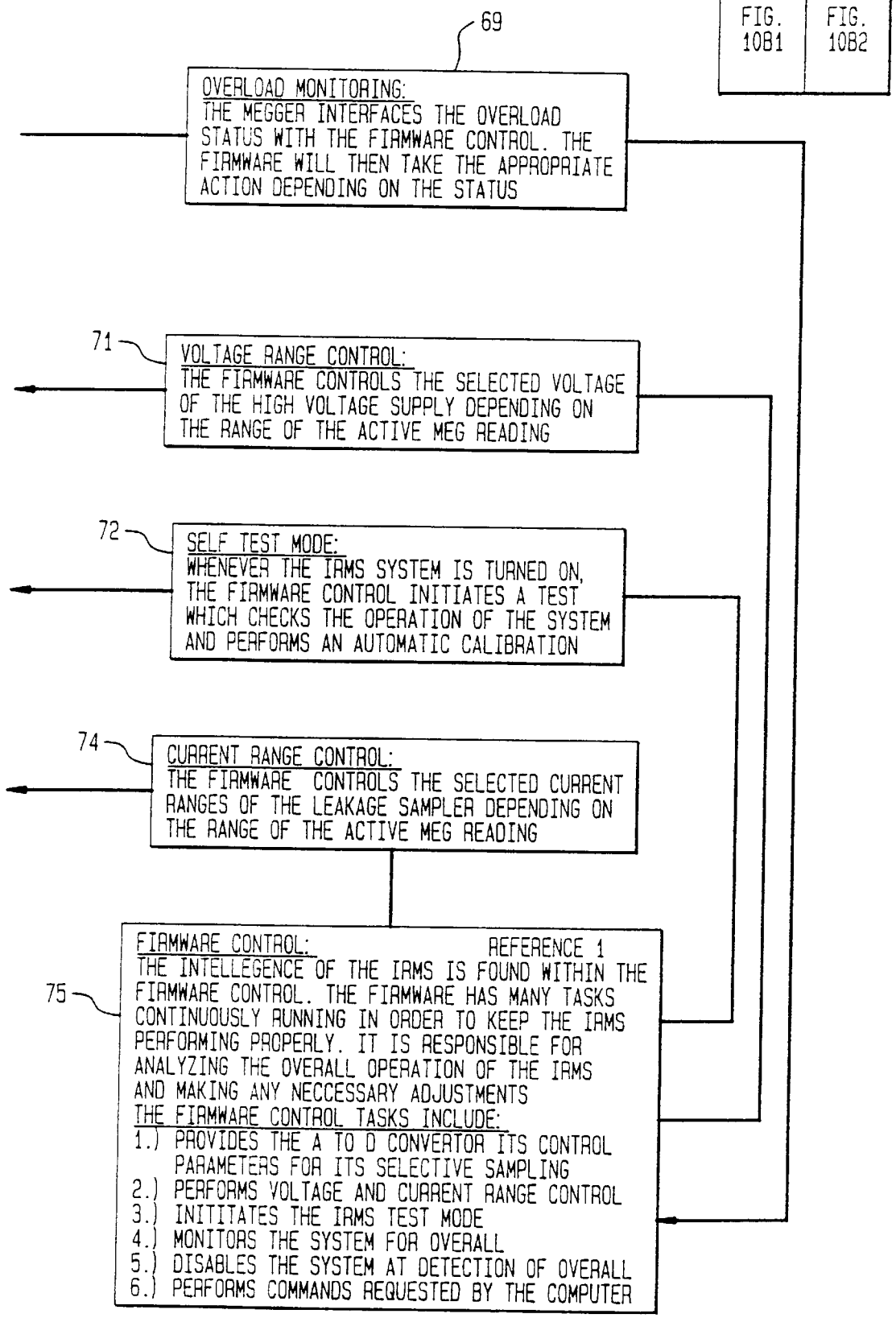

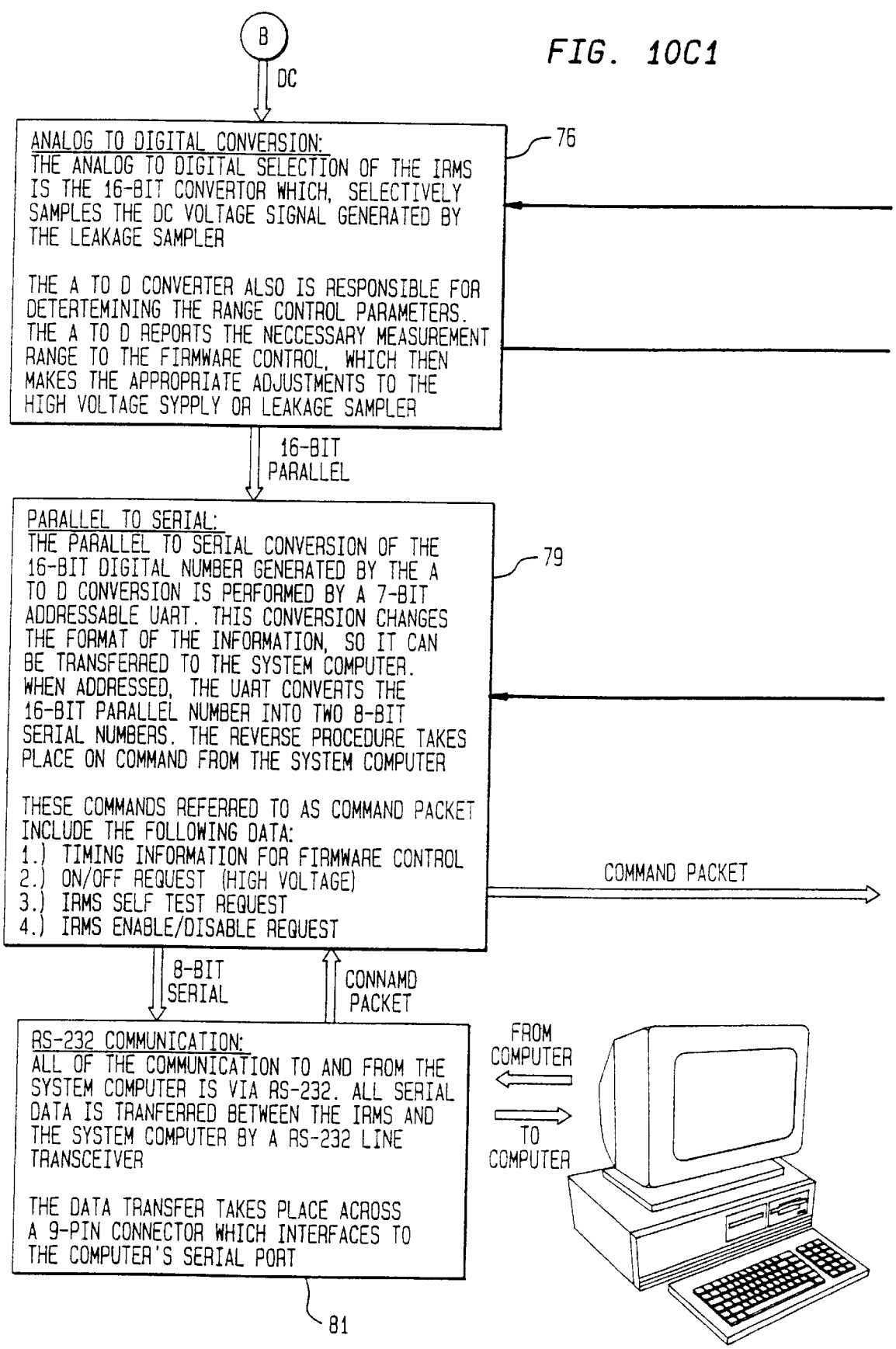
FIG. 10C1

FIG. 10C2
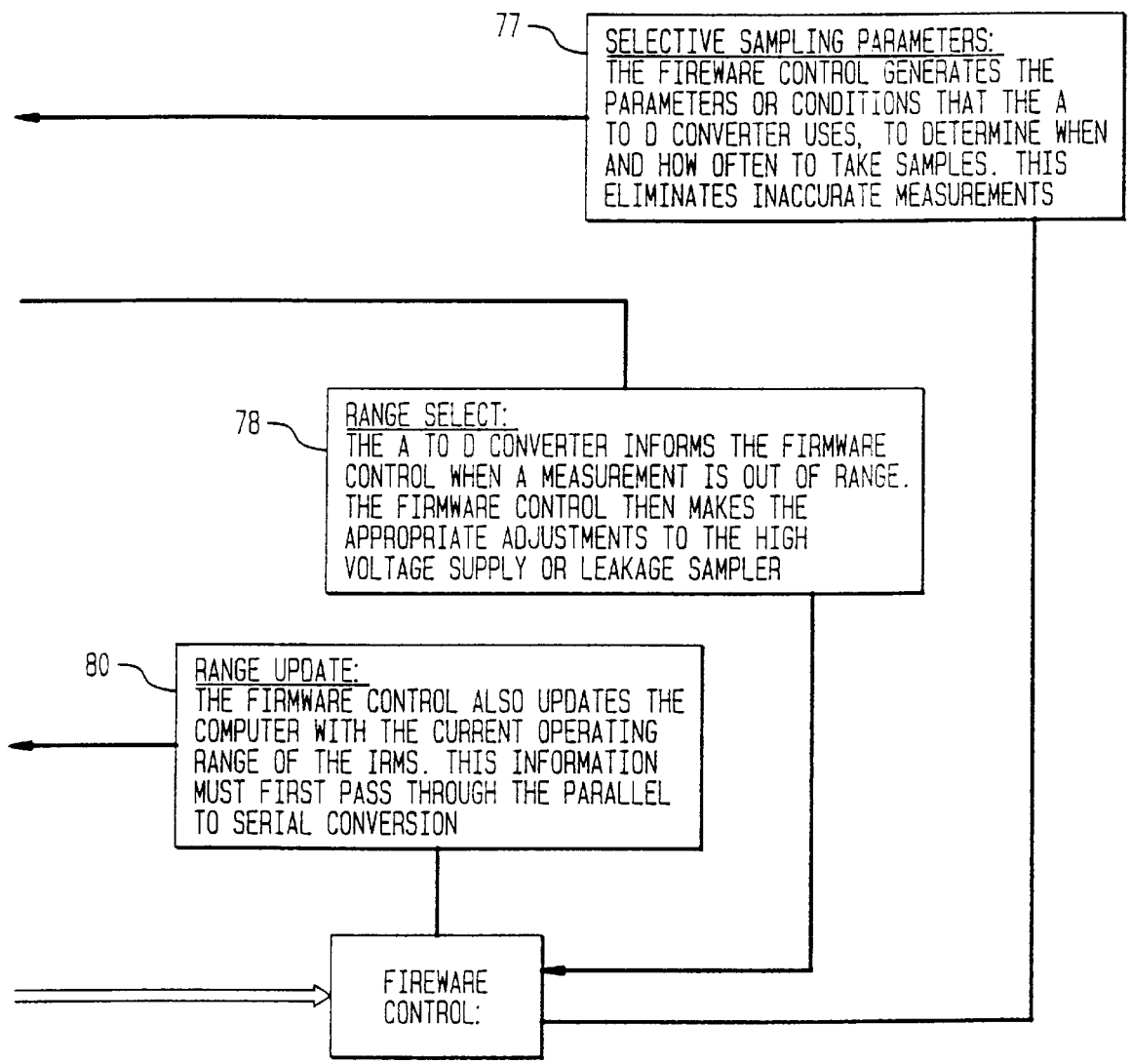
FIG. 10C
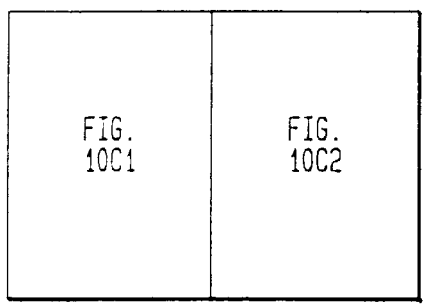

METHOD AND APPARATUS FOR SEPARATING AND ANALYZING COMPOSITE AC/DC WAVEFORMS

This application is a division of application Ser. No. 08/239,812 filed May 9, 1994 now U.S. Pat. No. 5,648,723.

TECHNICAL FIELD

The present invention is a method for separating and analyzing composite AC/DC waveforms in an electrical circuit and the apparatus for performing the method. The method and apparatus may be used for detecting and measuring grounding faults in electrical circuits, such as electrical lighting circuits.

BACKGROUND

In electronic AC transmission circuits it is often desirable to be able to detect, measure and monitor grounding faults and other imperfections which can be sensed by imposing a DC signal and monitoring the resulting current loss from the circuit. Such capability may be applied in any of a wide variety of applications, particularly in applications involving AC power supplies which must remain in service and cannot easily be powered down to allow for circuit testing. Such power supplies are typically found in large industrial electric motors, power supplies to large buildings., etc.

One of the principal obstacles to achieving this goal is the difficulty attendant to separating the imposed DC waveform from the AC waveform. The principal problem resides in the inability to provide sufficiently discrete means to accurately extract the DC waveform with sufficiently high signal-to-noise ratio to make measurement possible.

It is necessary to be able to isolate the DC source and detection circuitry from damage by exposure to high voltage AC waveforms.

It is also desirable to be able to monitor and measure impedance in AC circuits to determine where ground faults or other current drains might exist and to what extent Furthermore, it is most desirable to be able to be able to do this while the AC circuit is active. This not only saves down time but can be used to monitor circuit degradation to be able to predict failure well before it occurs or has progressed to a degree that the system must be deenergized before it has reached a dangerous state. Such advance information allows one to anticipate when failure is likely so that provisions to be made for repair or replacement of all or part of a given electrical system.

It is also advantageous to be able to be able to perform operational monitoring to eliminate the need for operators to handle high voltage circuitry, as is the case where systems must be deenergized to allow for the use of megaohm metering devices ("meggers") to measure impedance.

In view of the present disclosure and/or through the practice of the described invention, additional advantages, efficiencies and solutions to problems may become apparent to one skilled in the relevant art.

SUMMARY OF THE INVENTION

The present invention includes a method for separating AC and DC components of a composite waveform, and an inductive device capable of performing the method. The present invention also includes a ground fault condition monitoring system containing an inductive device of the present invention, and an electrical distribution system containing such a ground fault condition monitoring system, such as one for a lighting system.

The method of the present invention generally involves substantially separating the DC component from the AC component of a composite AC/DC waveform, The method comprises the general steps (a) obtaining an electrical connection to a composite AC/DC waveform; (b) conducting the AC/DC waveform through an inductive device which comprises (1) an inductor coil having an input pole and an output pole, with the inductive coil having a capacitor connected to the output pole to load the inductive coil, (2) a driver winding for the inductor coil, the driver winding adaptive to sense an AC current flow through the inductor coil; (3) a sampling resistor connected to the driver winding and adapted to detect the AC current in the form of a voltage across the sampling resistor; (4) signal processing circuitry comprising (i) an inverting amplifier adapted to amplify the voltage; and (ii) a phase shifter adapted to shift the phase of the voltage; and (5) a power amplifier connected to the signal processing circuitry and to the driver winding; and (c) measuring the DC component of the AC/DC composite waveform though the output pole of the inductor coil.

It is preferred that the phase shifter be in the form of circuitry adapted to shift the phase in two discrete shifts of about 90 degrees each.

The AC/DC separation method may in turn be used in a method for detecting ground fault condition in an active AC circuit. Such method involves the steps of (a) obtaining a circuit having an active AC waveform; (b) superimposing a DC voltage on that AC waveform using a DC voltage source, so as to form an AC/DC waveform; (c) separating the DC voltage from the composite AC/DC waveform; and (d) measuring the current flowing through the DC voltage source so as to be able to determine the existence of ground fault conditions in the circuit.

An apparatus of the present invention is an inductive device which comprises (a) an inductive coil having an input pole and an output pole, and being loaded by a capacitor; (b) a driver winding for the inductive coil, the driver winding adapted to sense AC current flow through the inductor coil; (c) a sampling resistor connected to the driver winding and adapted to detect AC current in the form of a voltage across the sampling resistor; (d) signal processing circuitry comprising: (1) an inverting amplifier adapted to amplify the voltage; and (2) a phase shifter adapted to shift the phase of the voltage; and (e) a power amplifier connected to the signal processing circuit and to the driver winding.

The present invention also includes an AC electrical circuit which contains ground fault detection circuitry which comprises an AC electrical circuit adapted to conduct an AC signal; (b) an inductive device (described above) in electrical contact wit the AC electrical circuit; (c) a power amplifier connected to the signal processing circuitry of the inductive device (described above) and connected to its driver winding; (d) a DC voltage source connected to the output pole of the inductive coil; and (e) a DC current measuring device adapted to measure DC current flowing to the circuit from the DC voltage source, in order to determine the presence of ground fault condition in the circuit.

An AC electrical circuit of the present invention may also be adapted to energize at least one AC load, and contains a ground fault condition detection circuitry described above. Such an AC electrical circuit may be adapted to drive any desired AC load, such as electrical lights, electromechanical devices, etc.

DESCRIPTION OF THE DRAWINGS

FIG. 2, comprising FIGS. 2A, 2B, 2C and 2D, is an electrical schematic of a portion of a ground fault detection system apparatus according to one embodiment of the present invention.

FIG. 3, comprising FIGS. 3A, 3B, 3C and 3D, is an electrical schematic of a portion of a ground fault detection system apparatus according to one embodiment of the present invention.

FIG. 4, comprising

FIGS. 10A, 10B, comprising FIGS. 10B1 and 10B2, and 10C, comprising FIGS. 10C1 and 10C2, show a detailed flow diagram explaining the operation of an aircraft lighting and control system with which the ground fault condition detection/measurement system of the present invention may be used.

DETAILED DESCRIPTION OF THE PREFERRED EMBODIMENT

The following describes one embodiment of the many aspects of the present invention which is also considered to be the best mode of the invention.

Figure 1:
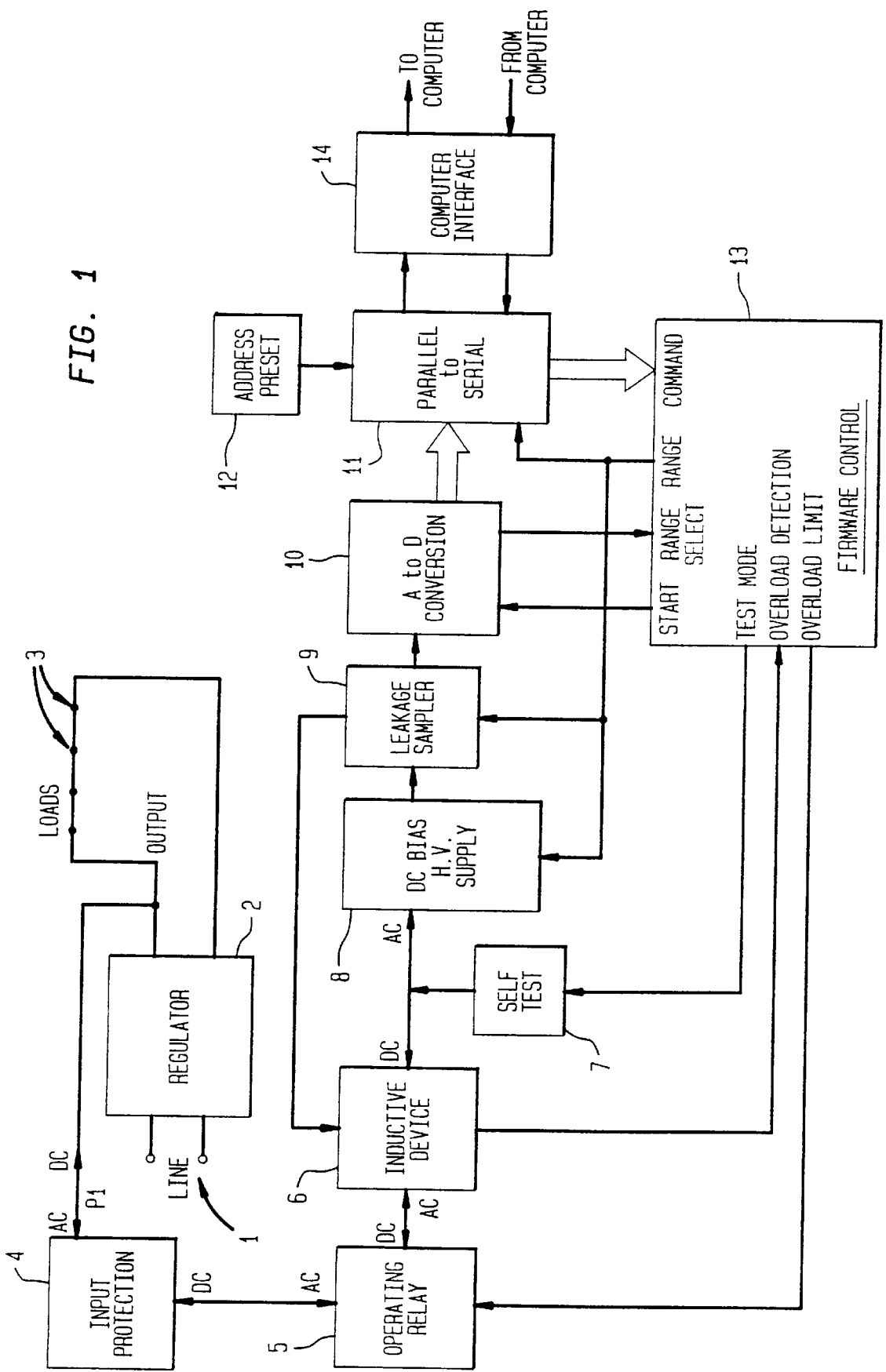
FIG. 1 is a block diagram showing the functional portions and logical relationships of the components of a ground fault condition detection apparatus according to one embodiment of the present invention, and showing in block form the portions of the ground fault detection system circuitry shown in FIGS. 2–5.

FIG. 1 is a block diagram showing the functional portions and logical relationships of the components of a ground fault condition detection apparatus according to one embodiment of the present invention, and an AC electrical circuit containing same. Many of these blocks correspond to dot-lined portions of the electrical schematics shown in FIGS. 2–5. FIG. 1 shows line voltage input 1 and regulator 2 which is connected to electrical loads 3. The ground fault condition detection circuitry is connected at point P1 through input protection 4 and operating relay 5. FIG. 1 also shows the position of the inductive device 6, self-test circuitry 7 DC bias voltage supply 8 and leakage sampler 9. Also shown is an analog to digital converter 10 with a parallel to serial connector 11 and address preset 12. Governing the function of the system is the firmware control 13 which may be provided with computer interface 14.

Input protection circuitry 4 protects the balance of the circuitry from surges coming from the active AC circuit, connected at P1. Operating relay 5 controls the access of the ground fault detection circuitry (fundamentally inductive device 6, high voltage supply 8 and leakage sampler 9) to the active AC circuit This relay operates to allow the ground fault detection system to calibrate itself when disconnected (by using self-test circuitry 7) and also opens if an input overload is detected. Inductive device 6 acts to strip the AC component from the combined AC/DC waveform created when the DC voltage is imposed on the active AC circuit. Leakage sampler circuitry 9 measures the current flowing from high voltage supply 8. Leakage sampler 9 also feeds back a signal to inductive device 6 to proportionately compensate for the effect of any DC current, flowing through the coil of the inductive device, on its operating characteristics (i.e. its ability to fully restrict the AC signal). Specifically, the leakage sampler provides a DC offset to the power operating amplifier to nullify the swinging choke effect brought about by the DC current flowing between the input and output of the coil.

The current sensed by the leakage sampler circuitry 9 in turn is recorded by means of analog-to-digital converter 10 which in turn interfaces, via parallel-to-serial port 11, with computer interface 14. Measured current flow is then related to the extent of ground fault condition.

Firmware control 13 performs many functions. The control provides start-up reset and holds all operations in reset during the start-up period, typically two seconds. It interprets the external computer's commands, and controls the external computer's ability to turn on the high voltage supply, to engage the input relay, to activate range hold function and to initiate the self-test circuitry. It also responds to signals from the inductive device 6 indicating when the inductive device 6 is in an overload condition in order to signal operating relay 5. The firmware determines the activation of the A/D conversion process, preferably synchronous with the signal ripple in the inductive device. During the serial interface transmit cycle, the A/D conversion process is inhibited. The firmware control 13 may be adapted to select from among two or more voltage ranges, depending upon the amount of current leakage sensed by the leakage sampler circuitry 9 as related by analog-to-digital converter 10. The firmware control 13 responds by signaling the high voltage supply 8 to select from two or more voltage ranges, while interfacing with the control computer via parallel-to-serial port 11 and computer interface 14.

Figure 2A:
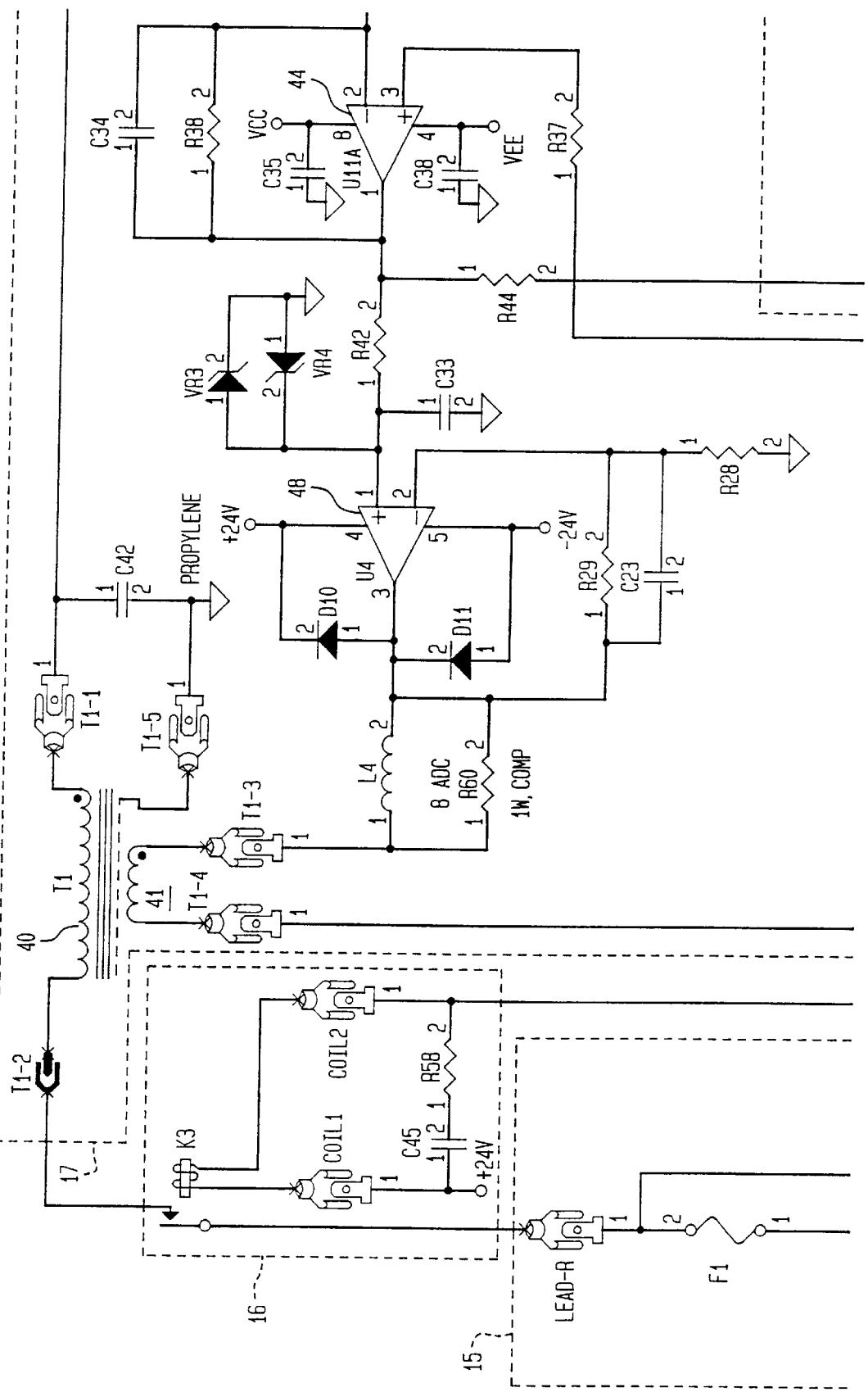
Figure 2B:
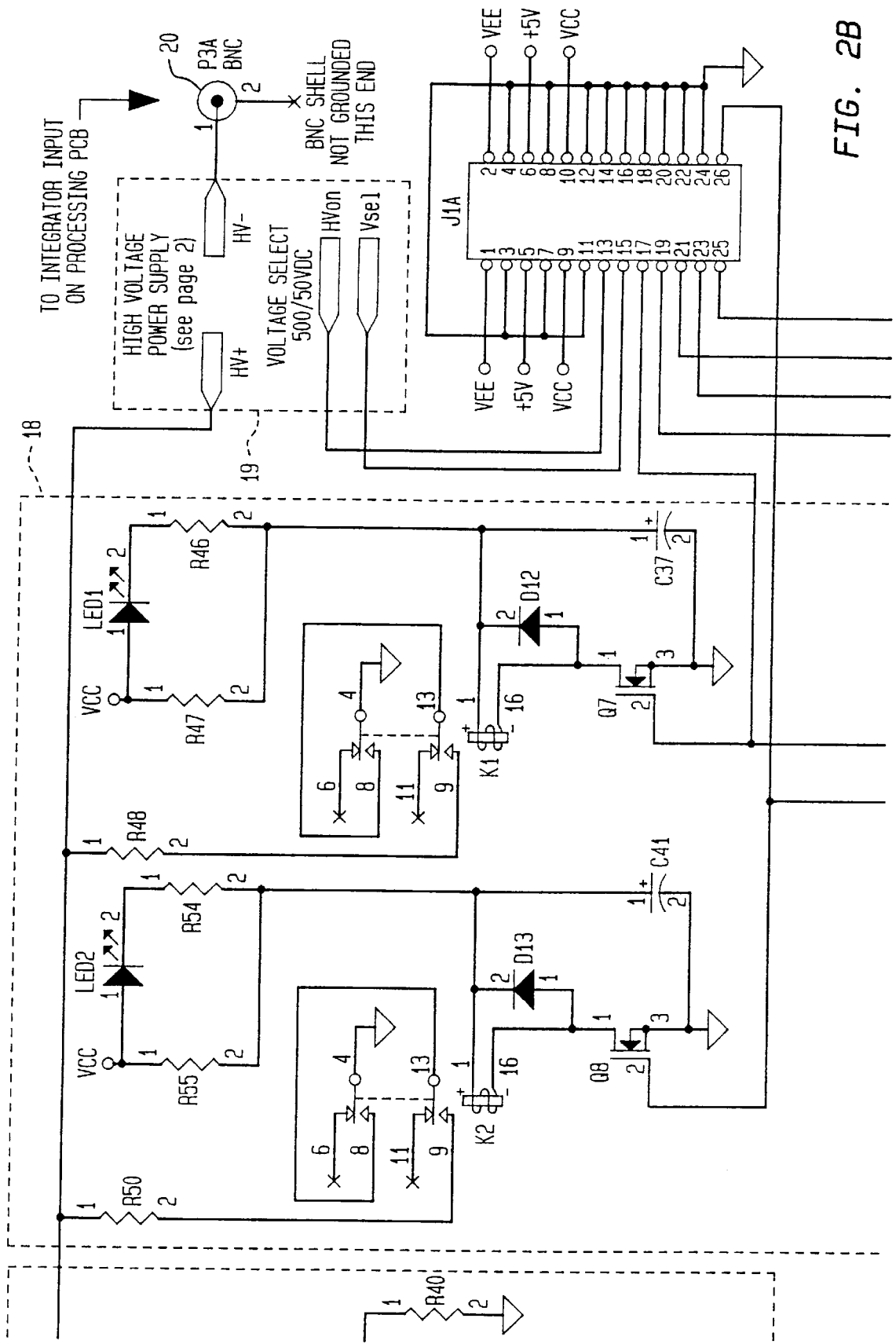
Figure 2C:
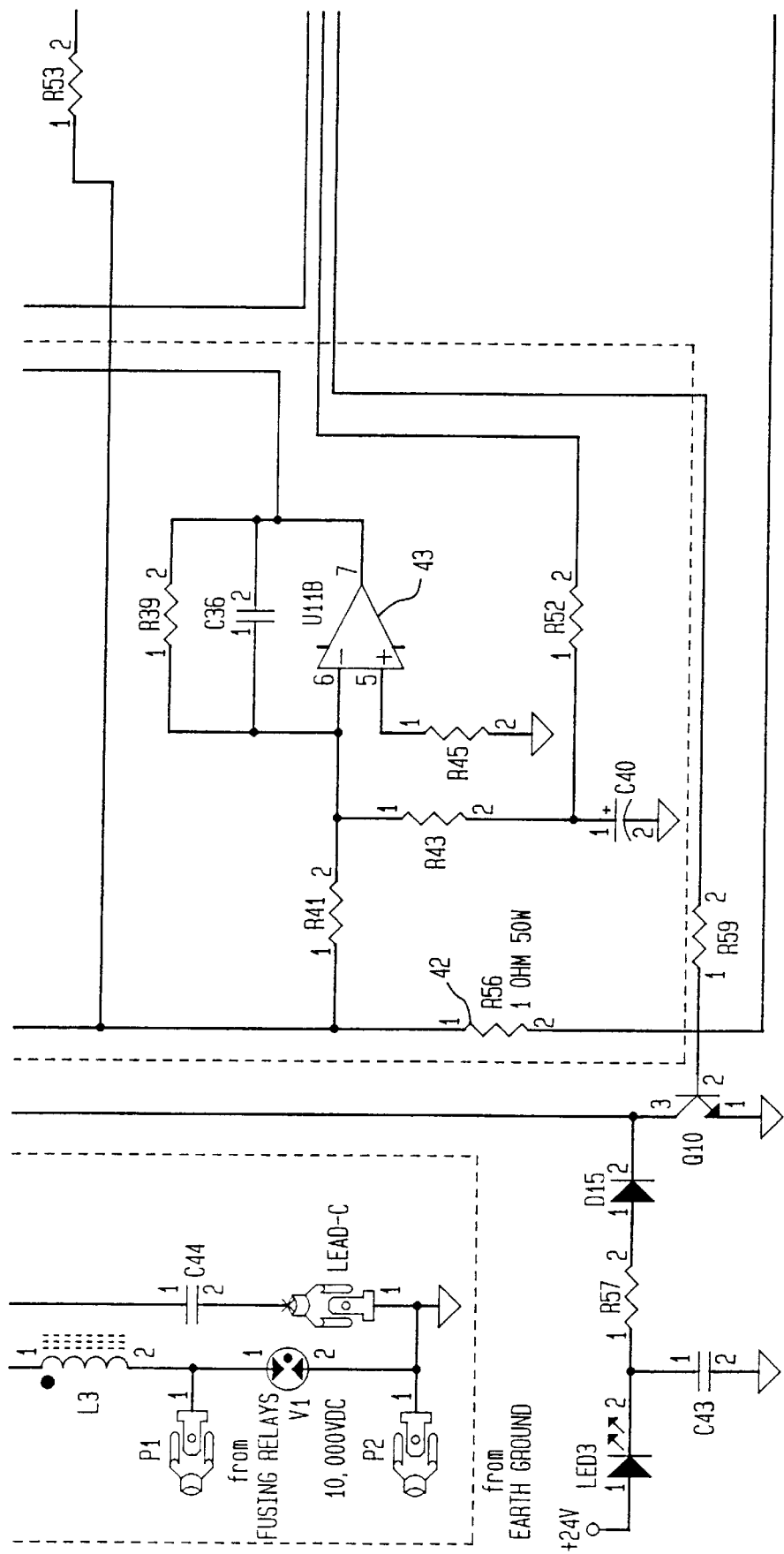

FIG. 2, comprising FIGS. 2A, 2B, 2C and 2D, is a portion of the electrical schematic of the ground fault condition detection system. FIG. 2 shows input protection circuitry 15 (corresponding to block 4 of FIG. 1), operating relay 16 (corresponding to block 5 of FIG. 1) and inductive device 17 (corresponding to block 6 of FIG. 1). Inductive device 17 includes inductive coil 40 and driver winding 41, Driver winding 41 is connected to sampling resistor 42 which in turn is connected to signal processing circuitry which includes inverting and non-inverting integrators 43 and 44, respectively. Also shown is self-test circuitry 18 (corresponding to block 7 of FIG. 1) and high voltage power supply 19 (corresponding to block 8 of FIG. 1) in this embodiment. The high voltage supply may be set at various voltage levels, such as, for instance 0 volts, 50 volts (at both high and low sensitivity) and at 500 volts. FIG. 2 also shows coaxial connection 20 which connects to coaxial connection 21 in FIG. 3. This connection corresponds to the connection between blocks 8 and 9 of FIG. 1.

The AC/DC waveform separator operates by having high voltage source 19 impose a DC voltage through inductor coil 40 and onto the AC circuit, through the operating relay 16 and protection circuitry 15, via lead P1.

Any AC waveform entering via lead P1 and through protection circuitry 15 and operating relay 16, is suppressed by inductor coil 40, and is prevented from progressing to disrupt or damage circuitry beyond this point. If there is a ground fault condition on the AC circuit, a DC current will begin to flow through inductor coil 40 in an amount corresponding to the degree of current leakage from the circuit loop attached to P1. In that event, the flow of the DC current through either of sampling resistors 45 or 46 (see FIG. 3); resistor 45 sampling for the extreme low range and resistor 46 for the other ranges.

A large AC signal is available on inductor coil 40. As dv/dt increases to a significant level, the core of the inductor approaches the efficiency curve caused by an increase in magnetic flux density, which causes a decrease in effective inductance. This signal is transferred by transformer principle to driver winding 41. After transfer, the imposed current is sensed as a voltage across resistor 42. The signal is then amplified, inverted and phase-shifted via inverter 43, non-inverting amplifier 44, in order to drive power operational amplifier 48 (preferably having a performance level that swings ±20 V at 10 amps). The amplified signal is then used to drive the other terminal of driver winding 41 (that terminal not directly connected to sampling resistor 42). By doing this, the magnetic energy lost is compensated, and thus the performance of the inductor coil is restored.

Figure 3A:
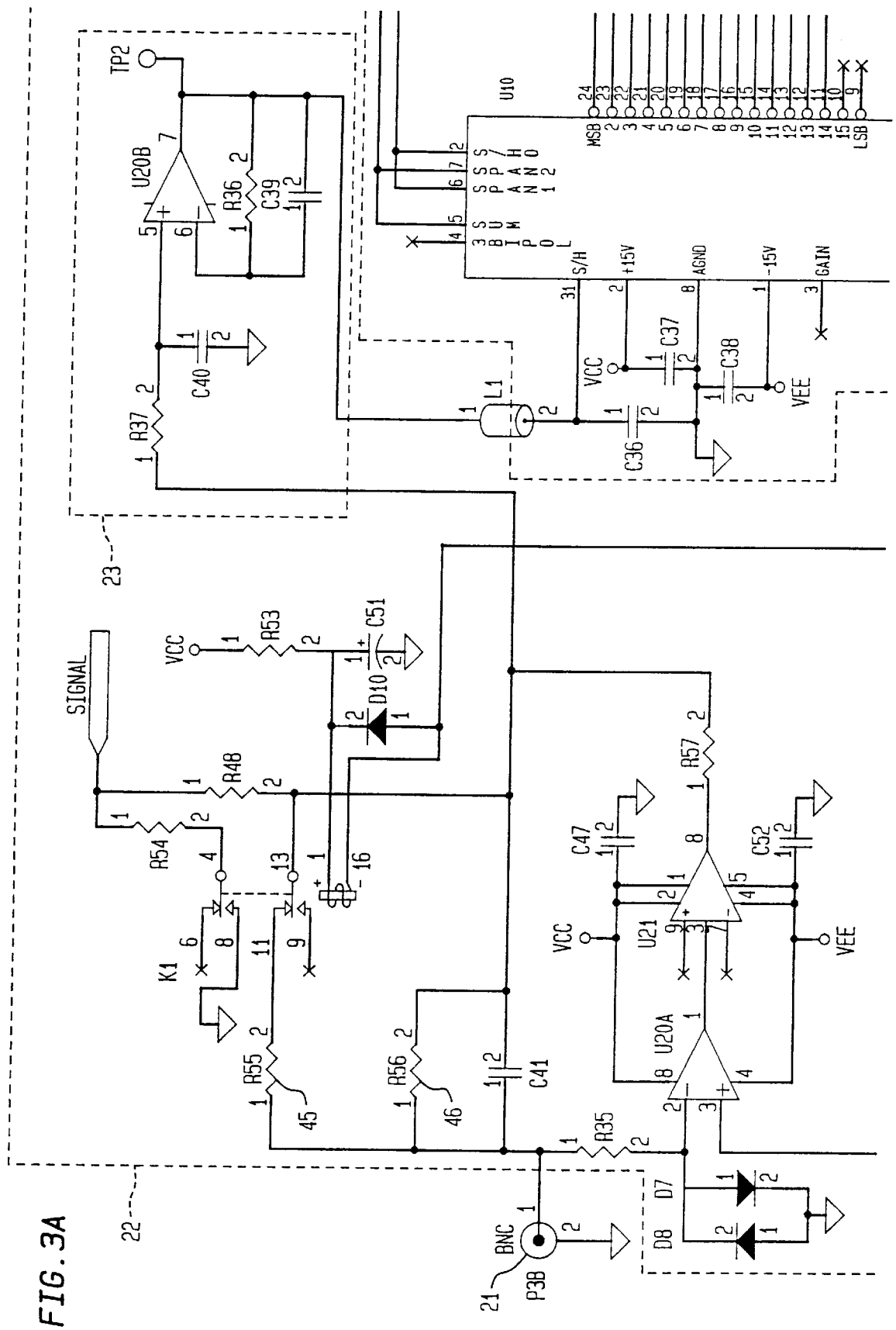
Figure 3B:
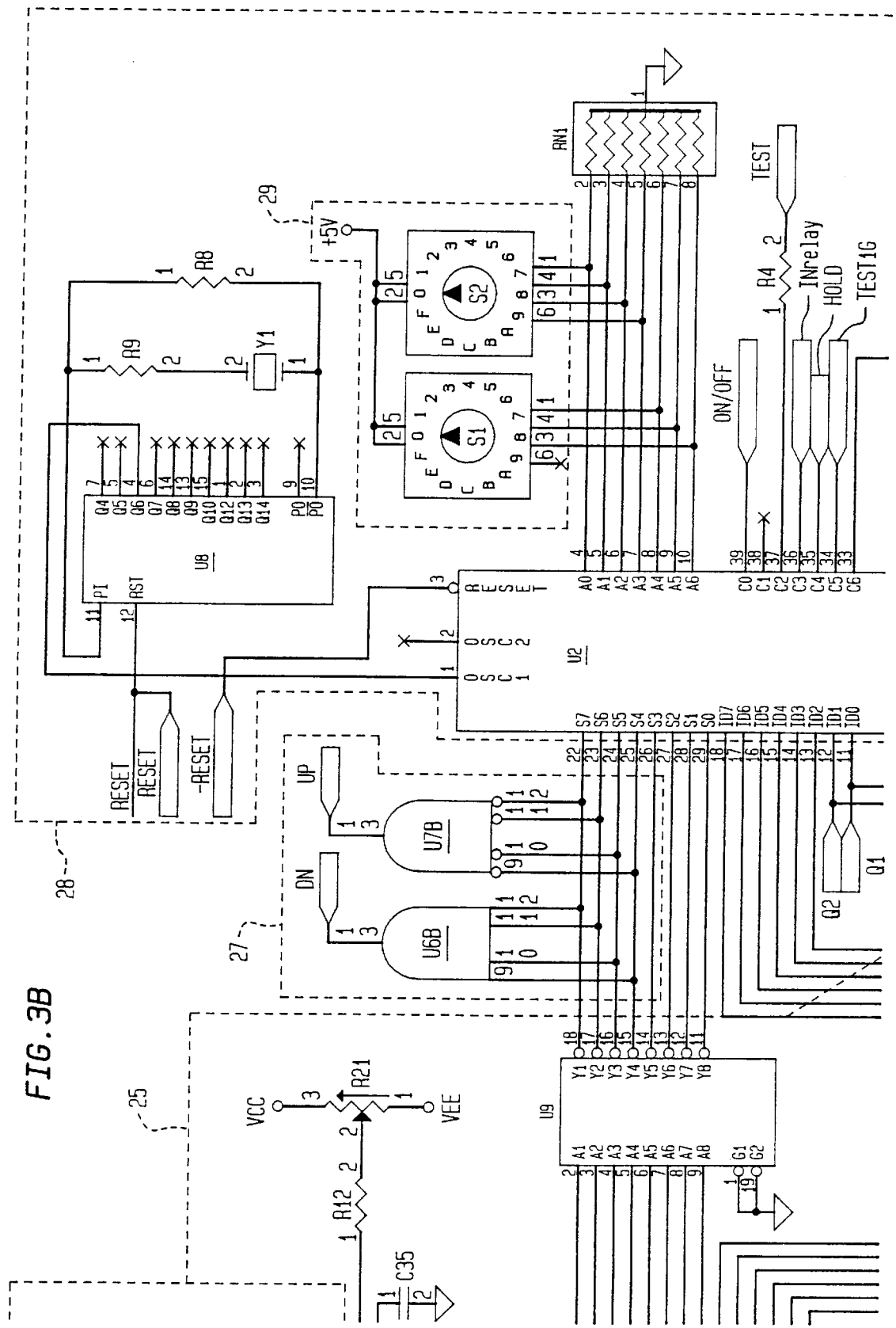
Figure 3C:
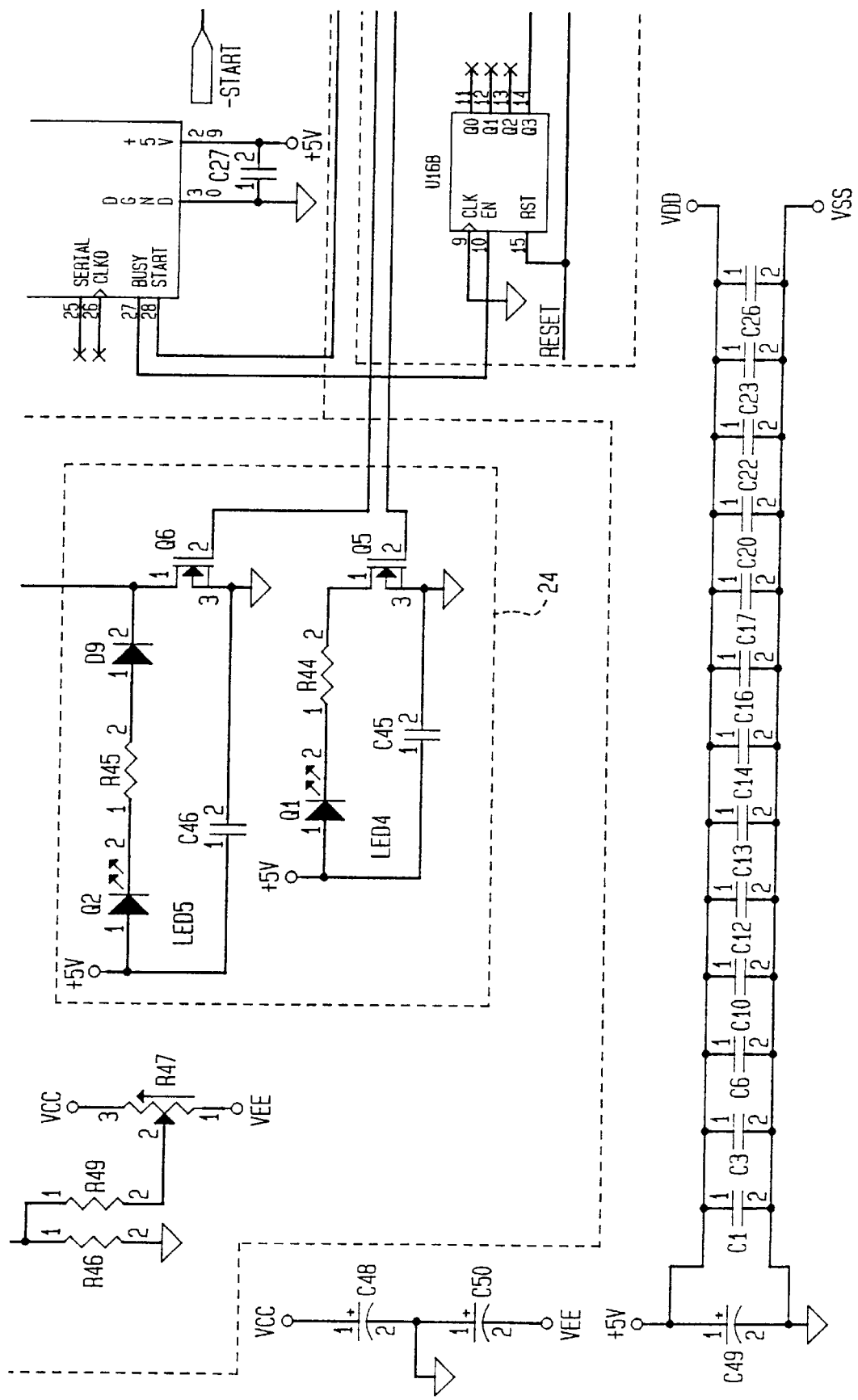
Figure 4A:
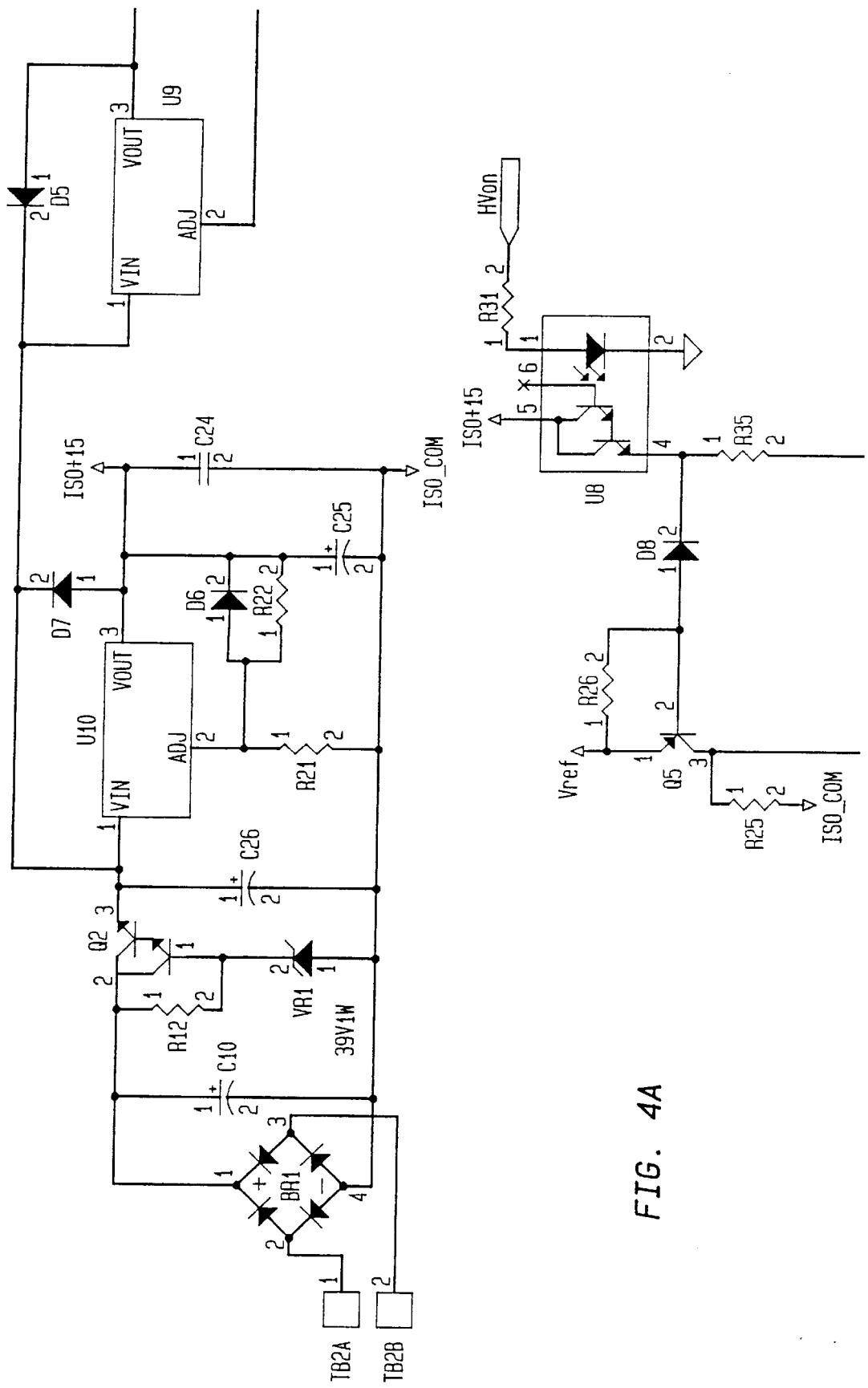
FIGS. 4A, 4B, 4C and 4D, is an electrical schematic of a portion of a ground fault detection system apparatus according to one embodiment of the present invention.
Figure 4B:
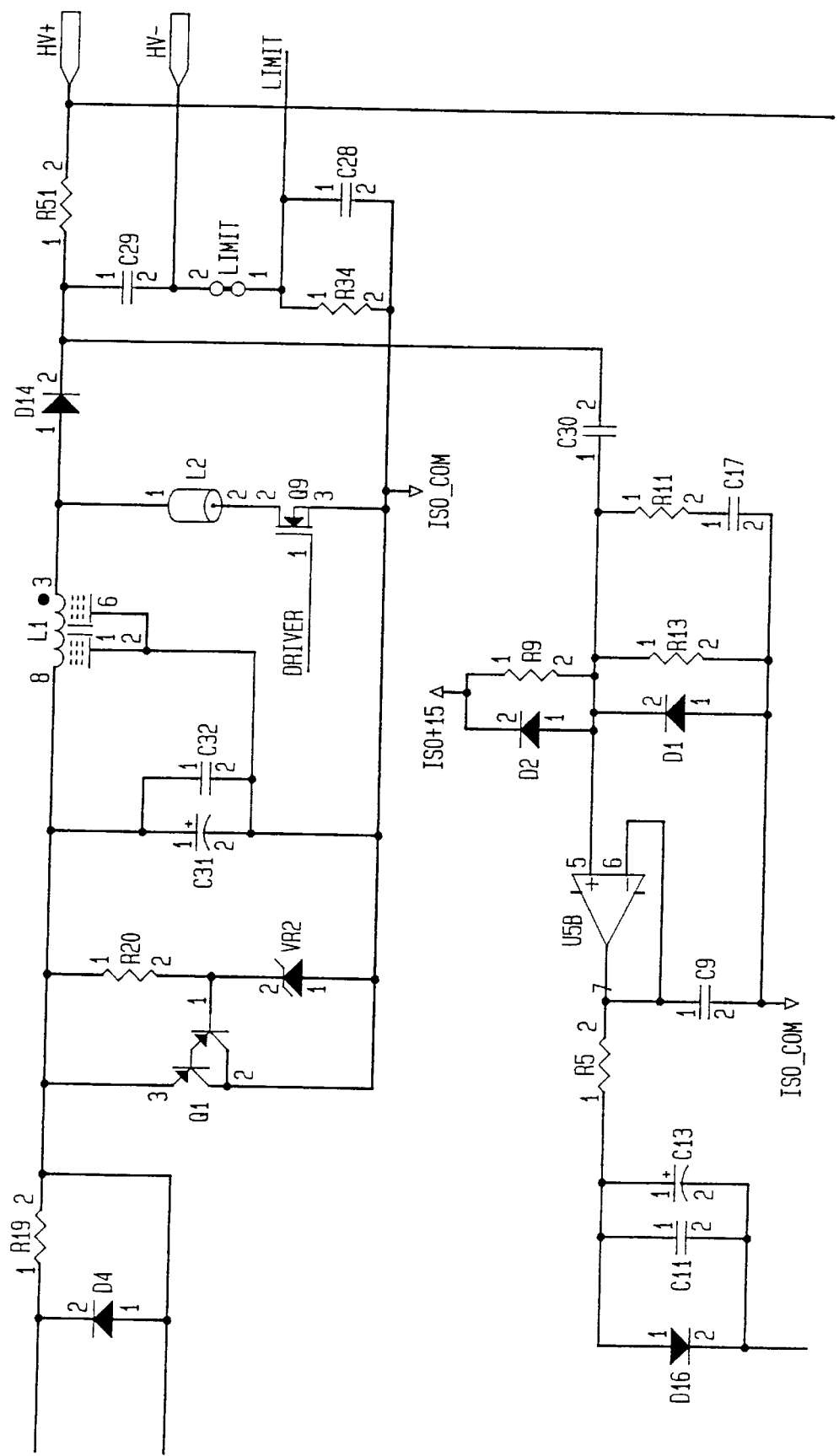
Figure 4C:
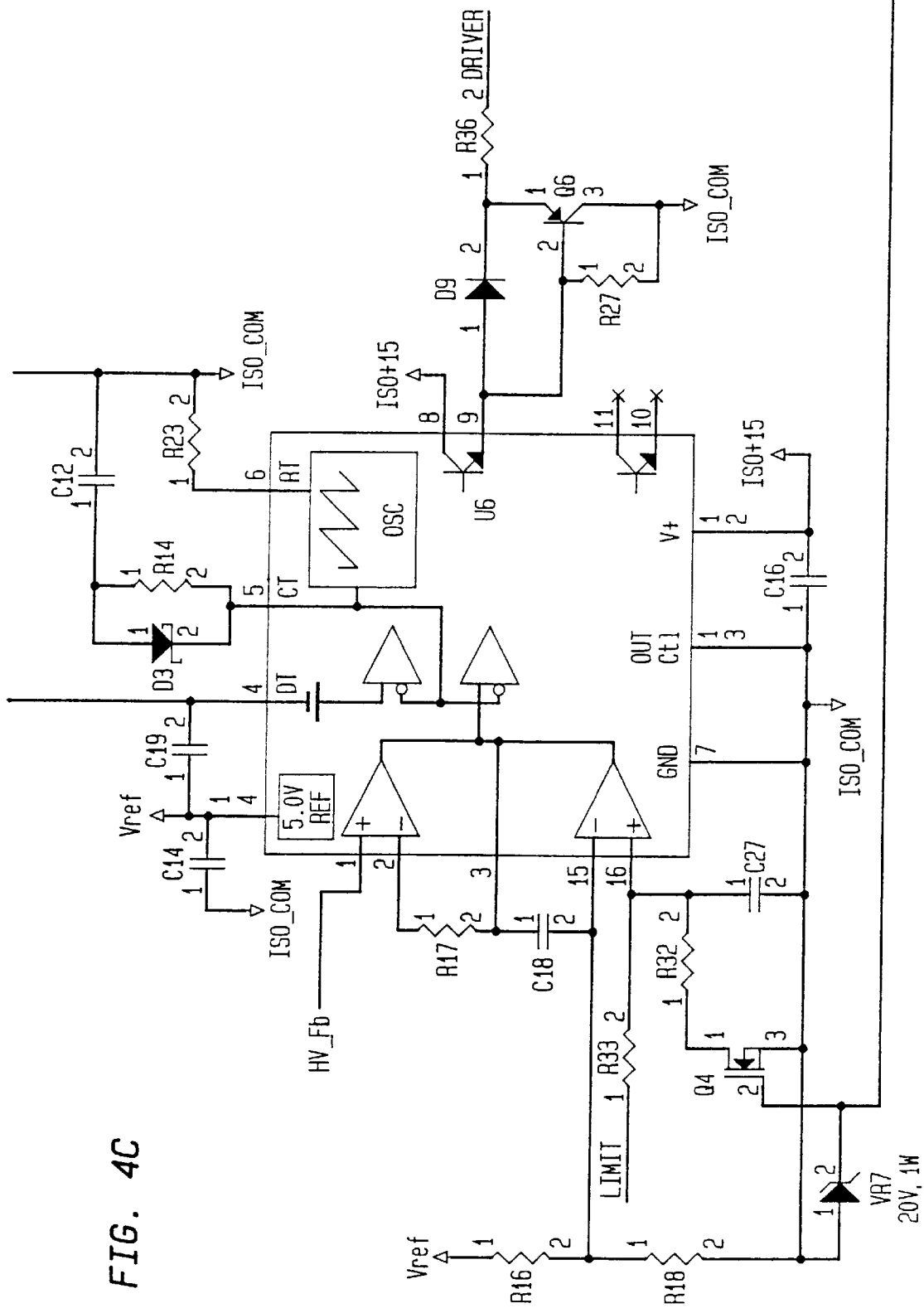
Figure 4D:
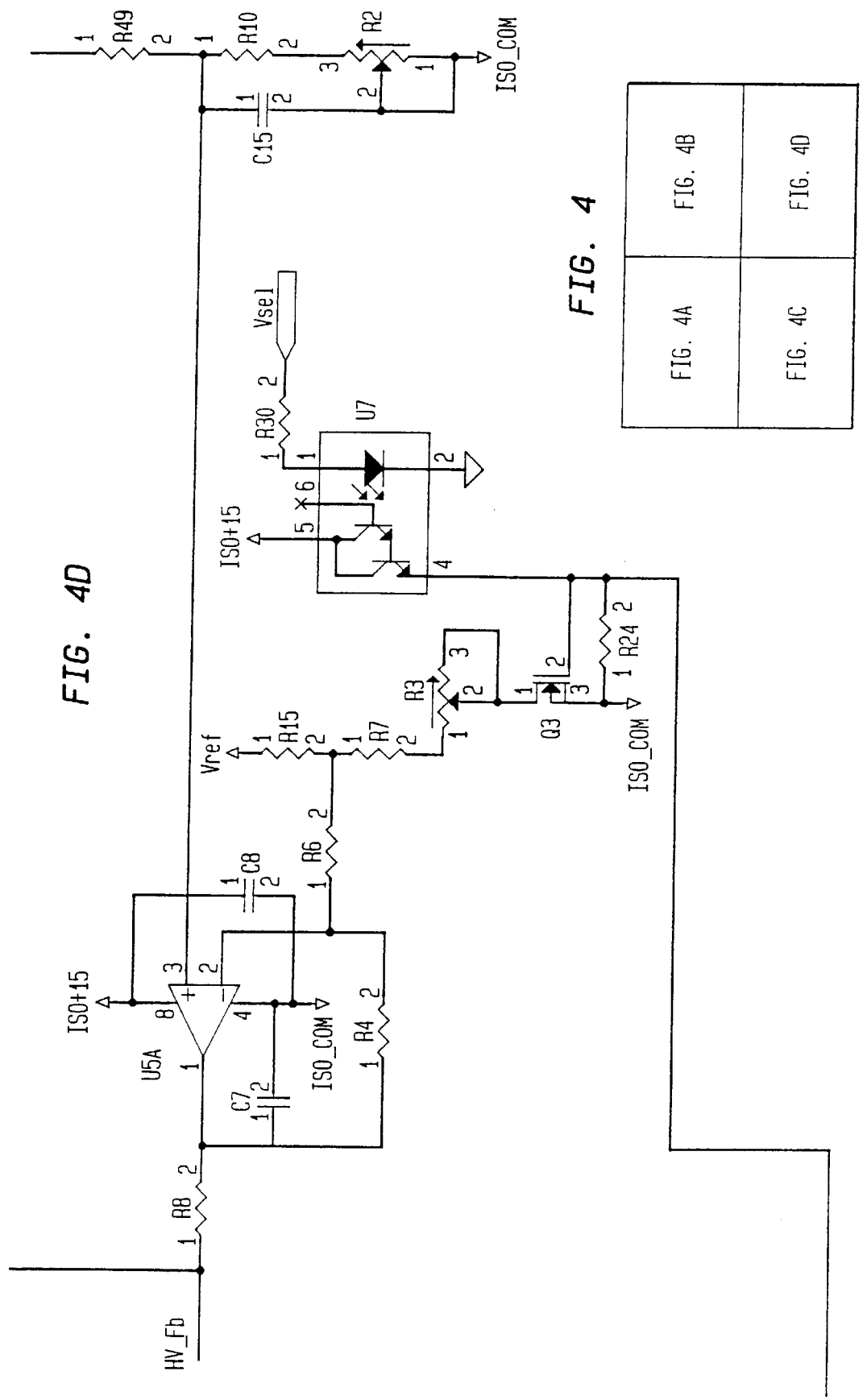

FIG. 3, comprising FIGS. 3A, 3B, 3C and 3D, shows leakage sampler 22 (corresponds to block 9 of FIG. 1) which contains buffer amplifier 23 and range indicator 24. Also shown in FIG. 3 is analog to digital converter 25 (corresponding to block 10 of FIG. 1) and firmware control 26 and 27. Range selection circuitry 27 sets a binary level detection from the output of the A/D converter (e.g. a 14-bit output). This circuitry determines if the level is excessively high or low, the command increment down or increment up, respectively, is issued to the range counter 49. The resulting range selected is seen at Q1 and Q2 (i.e. to select from among HV off, low Ohm, 50V and 500V). Range selection circuitry 26 is a delay counter to delay the ability to change range for a pre-set number of the A/D clock cycles. Parallel-to-serial converter 28 (corresponding to block 11 of FIG. 1) is also shown in FIG. 3, as is address pre-set 29 (corresponding to block 12 of FIG. 1) and computer interface 30 (corresponding to block 14 of FIG. 1) (which, for instance may be a RS232 or RS244 port).

FIG. 4, comprising FIGS. 4A, 4B, 4C and 4D, shows a high voltage power supply for the DC bias, showing that corresponding to block 8 of FIG. 1 and item 19 of FIG. 2 in more detail.

Figure 5A:
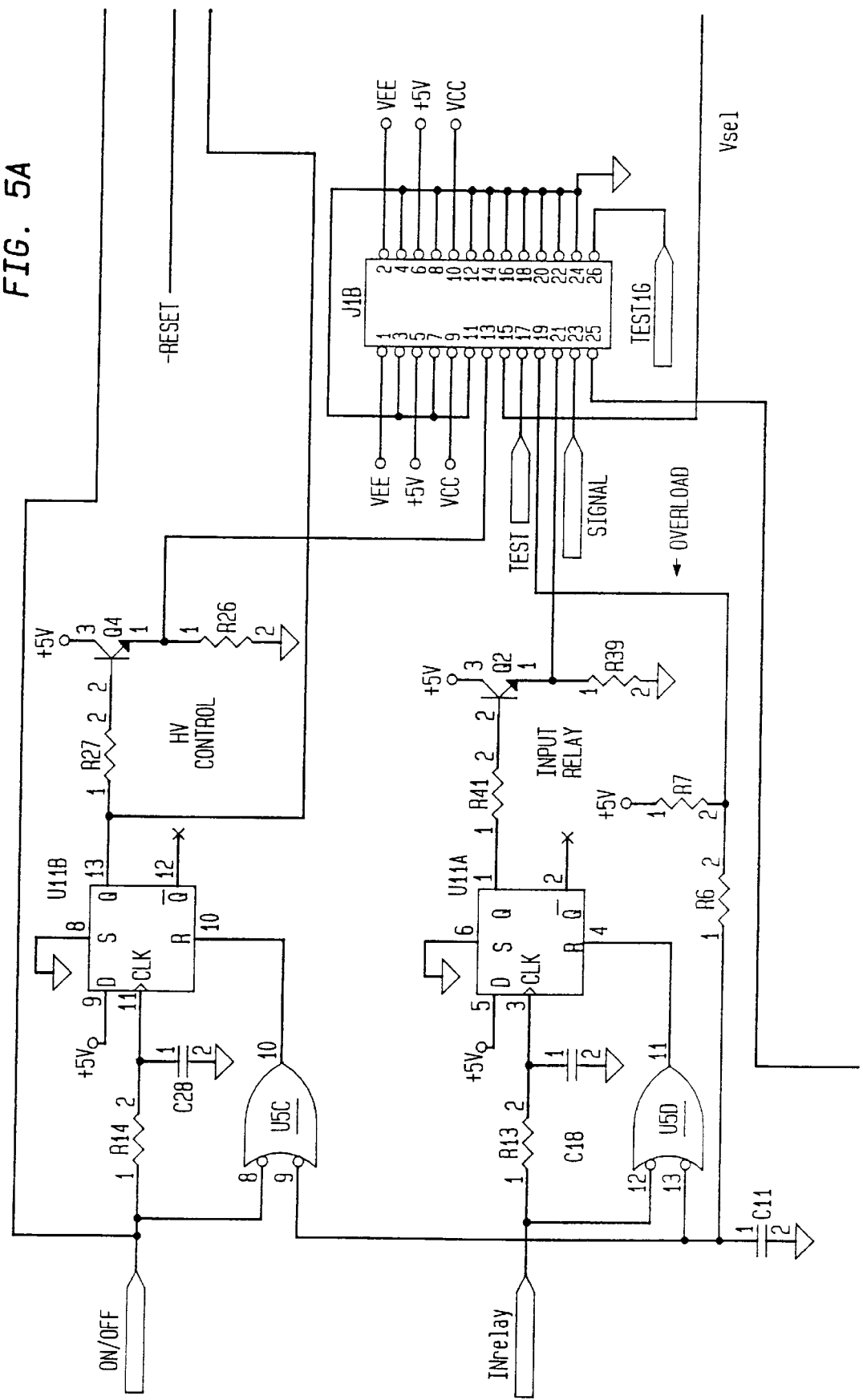
FIGS. 5A, 5B, 5C and 5D, is an electrical schematic of a portion of a ground fault detection system apparatus according to one embodiment of the present invention.
Figure 5B:
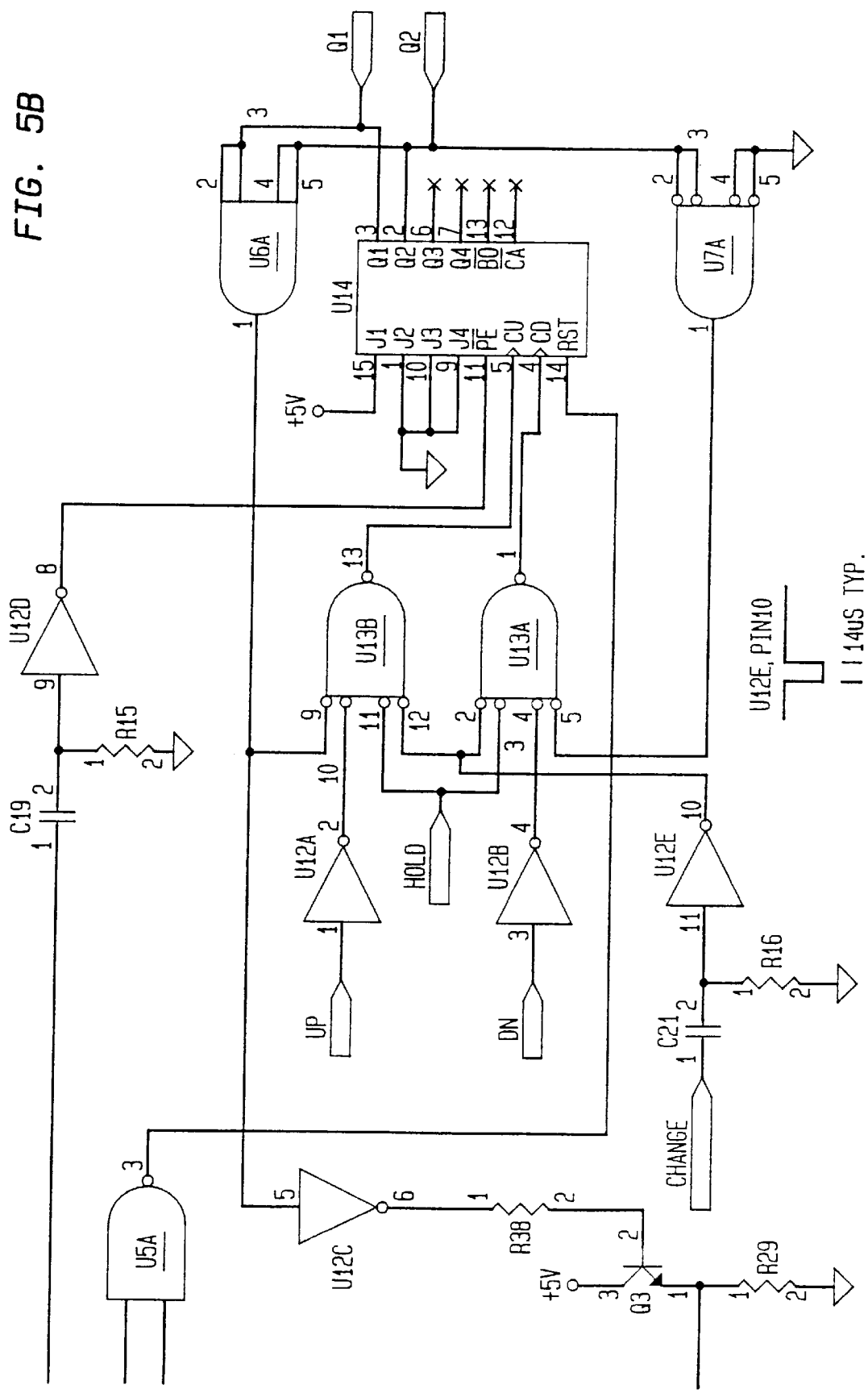
Figure 5C:
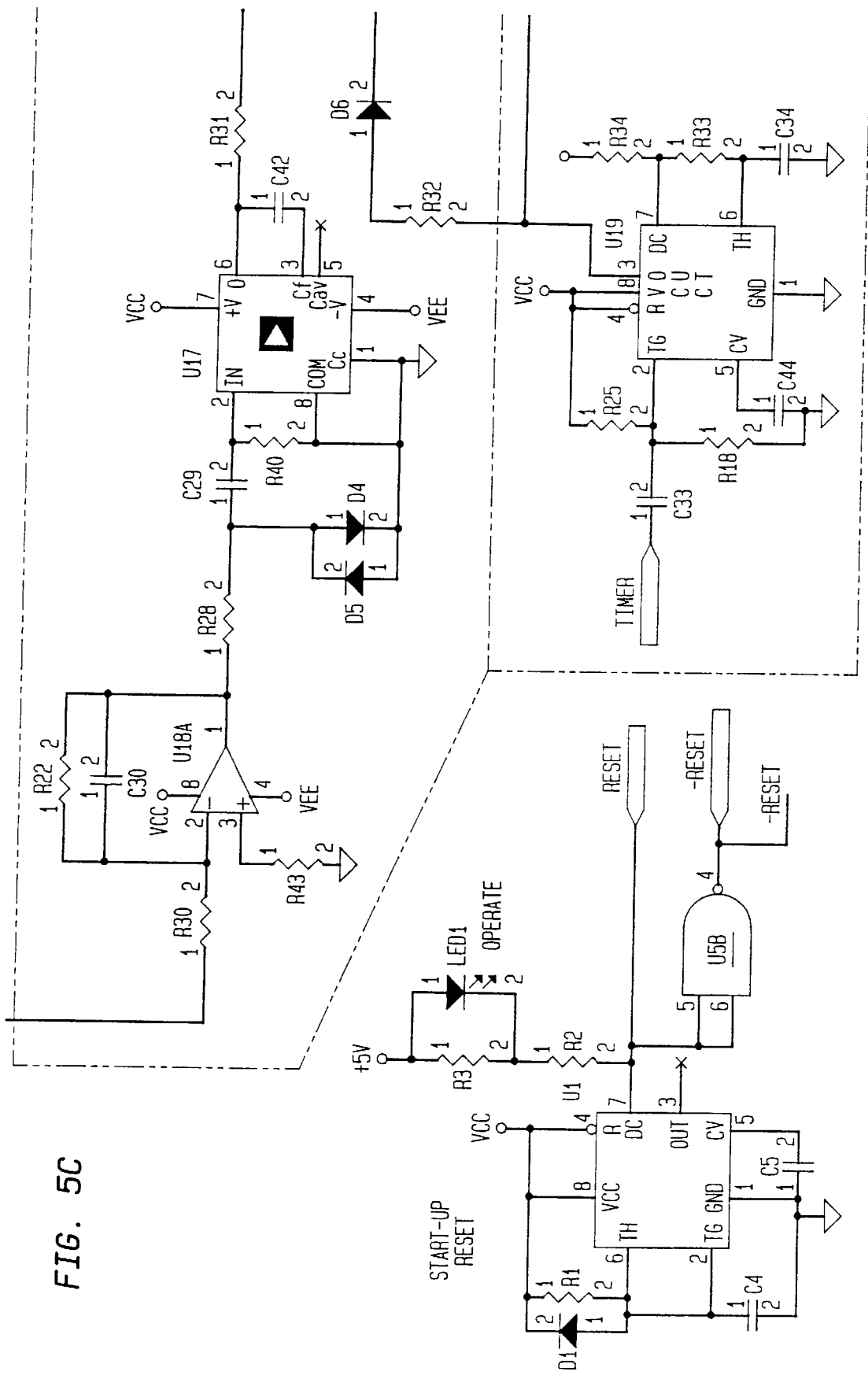
Figures 5, 5D:
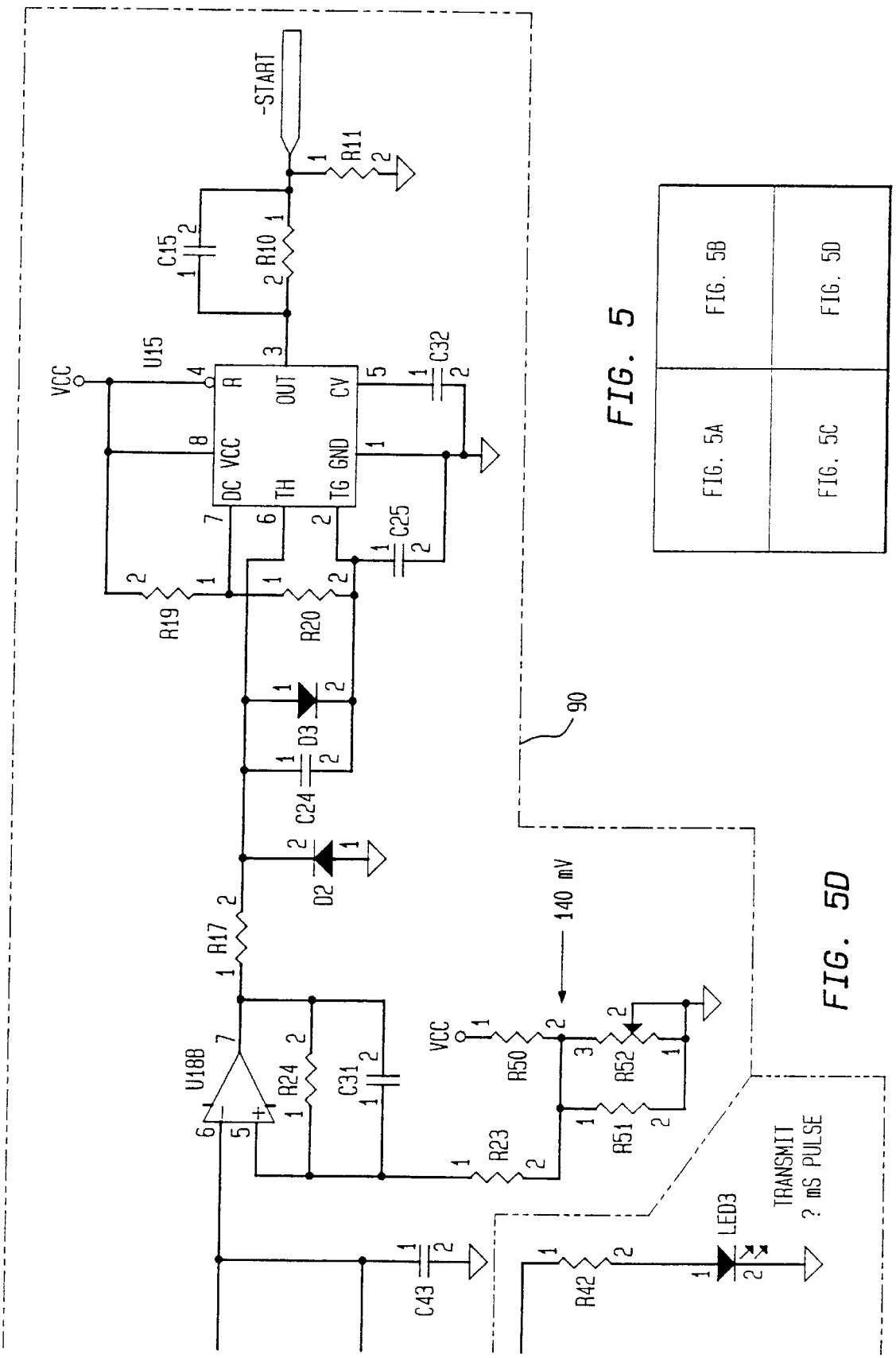
FIG. 5, comprising

FIG. 5, comprising FIGS. 5A, 5B, 5C and 5D, is an electrical schematic showing the firmware control portion of the present invention, corresponding to block 13 of FIG. 1. FIG. 5 shows synchronous A/D start conversion circuitry. This detects the ripple as seen at the input to the power operating amplifier 48 of FIG. 2, and starts the A/D process on a timed basis at the lowest point of the ripple. Also shown is timer 91 that inhibits the A/D start conversion when the computer interface is transmitting. Overload detector 92 (see FIG. 2) detects the level of overload that occurs in the inductive device. If the inductive device reaches near its upper limit, the detector signals the firmware control to open the operating relay, discontinuing input signal and also turning off the high voltage supply.

FIGS. 6–11 illustrate an AC circuit typical of those that may be tested using the method and apparatus of the present invention, and which would correspond to items 1, 2 and 3 of FIG. 1.

Figure 6:
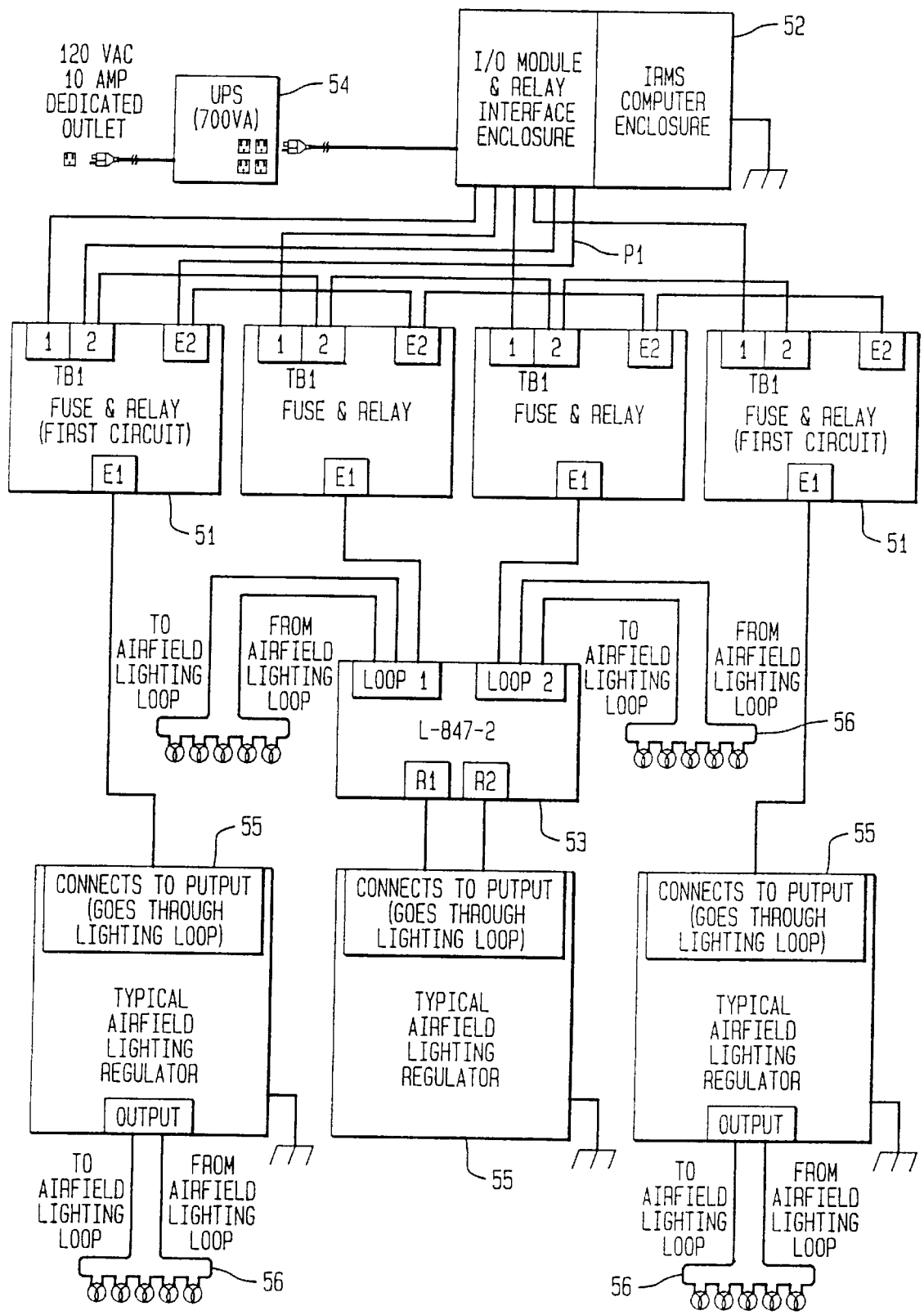
FIG. 6 is a block diagram of the an airfield lighting and control system with which the method and apparatus of the present invention may be used.

FIG. 6 is a block diagram of the overall ALCS system for use in accordance with one embodiment of the present invention. FIG. 6 shows fuse and relay assemblies 51, the insulation resistance monitoring system ("IRMS") enclosure 52, L-847 circuit selectors 53, and on-line uninterruptable power supply ("UPS") 54 and constant current regulators ("CCRs") 55 (corresponding to item 2 of FIG. 1). Also shown are several airfield lighting loops 56 (of which one would correspond to item 3 of FIG. 1). An airfield supplied with an ALCS in accordance with the present invention may have one or more such systems operating independently of each other without being connected.

A function of the IRMS is to monitor the insulation resistance of the high voltage series circuit used in the ALCS. The IRMS system is able to measure and record the insulation resistance of multiple circuits so that long term degradation of the field cabling, and other components of the circuit, can be monitored and characterized. The IRMS of the present embodiment can be separated into three principle sections. These are: (1) fuse and relay assemblies which can control switching between multiple lighting circuits; (2) an insulation resistance meter which measures the circuit resistance; and (3) the IRMS microprocessor which controls the lockout relays and resistance data collecting.

Figure 7:
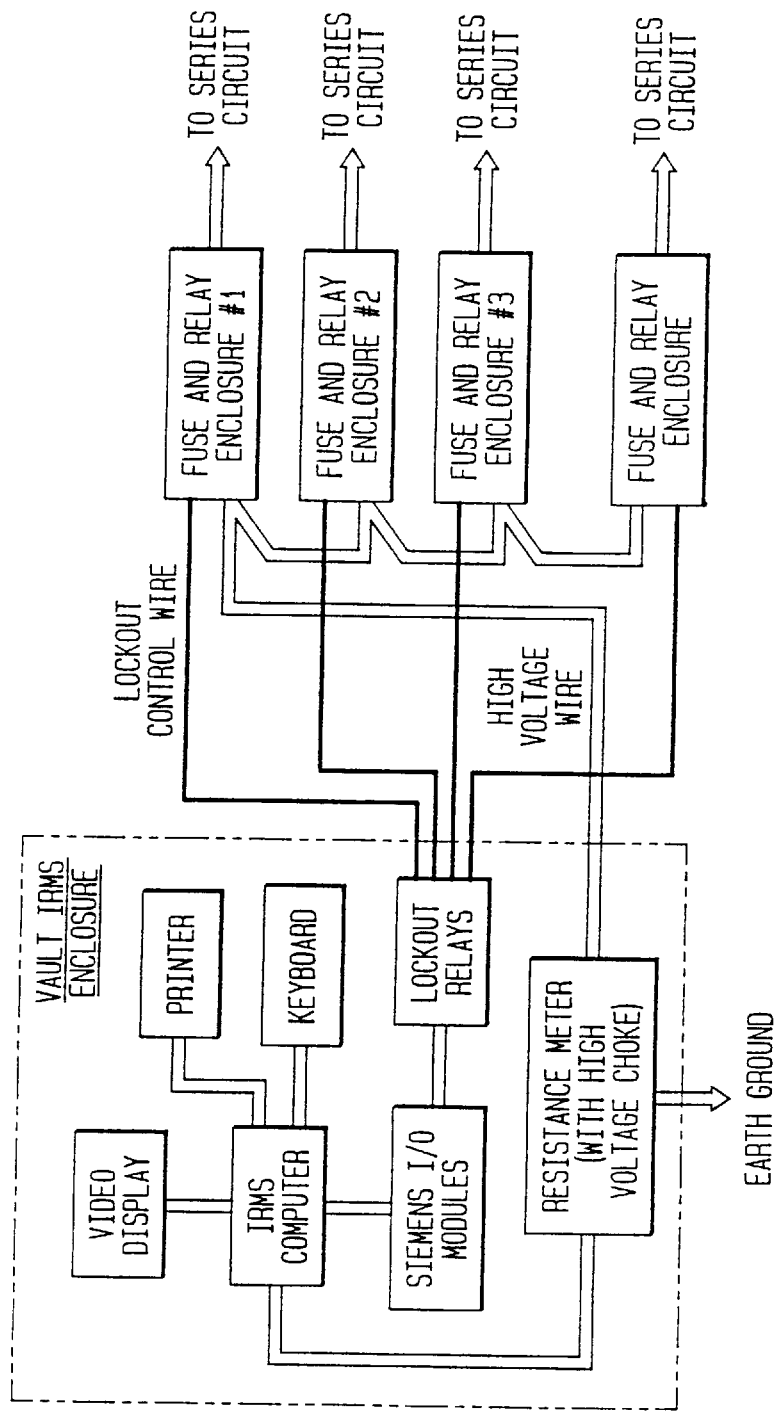
FIG. 7 is a flow diagram depicting the major components of an airfield lighting and control system using a ground fault condition monitoring system in accordance with one embodiment of the present invention.

A flow diagram depicting the major components of the IRMS is shown in FIG. 7. Where more than one high voltage series circuit is being used, the IRMS system may energize only one circuit for resistance measurement at a given time, thus locking out all other monitored circuits. The IRMS enclosure contains banks of interlocking relays for this purpose. These lockout relays are the first portion of the isolation circuitry.

The final stage of the isolation circuitry includes fuse and relay assemblies which may be located in small enclosures that are mounted at each monitored regulator. These enclosures house another high voltage relay and a high voltage fuse.

Figure 8:
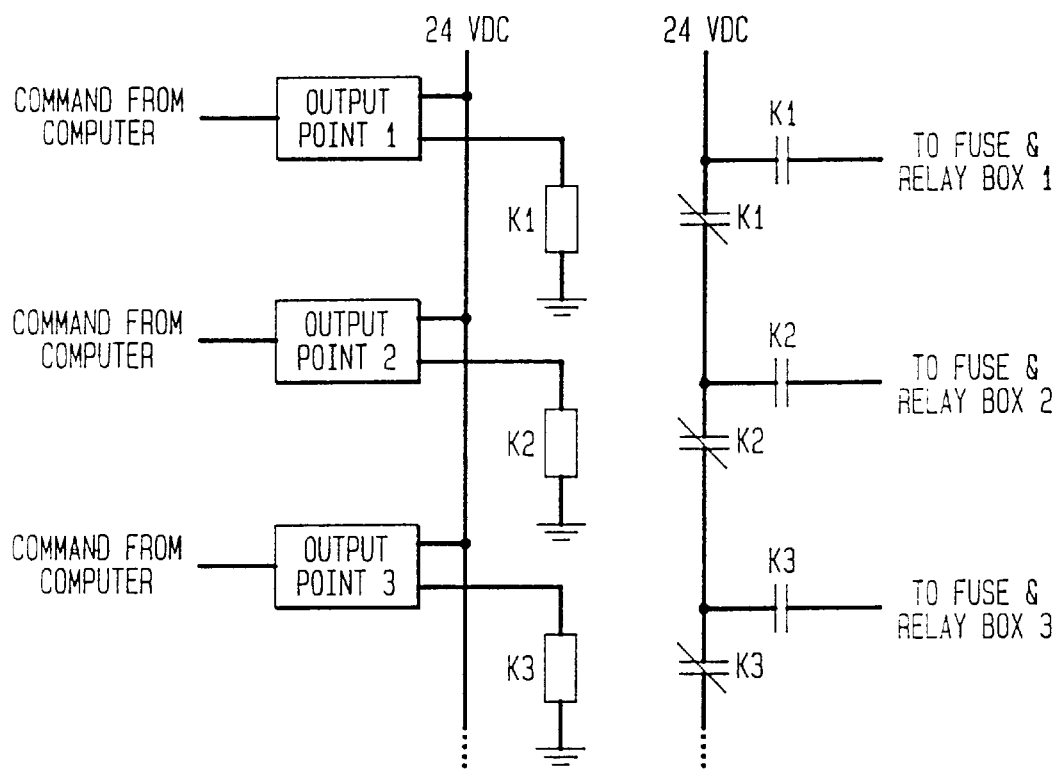
FIG. 8 is a ladder diagram of the lockout relays used in accordance with an aircraft lighting and control system with which the ground fault condition monitoring system of the present invention may be used.

The IRMS has been designed such that the lockout relays are interlocked to allow only one relay and fuse enclosure to be energized at a time. A ladder diagram of the lockout relays is shown in FIG. 8. Where more than one circuit is to be monitored, this allows only one field circuit to be connected to the resistance meter at any given time.

The final stage uses the fuse and relay circuitry to isolate the high voltage of the lighting circuits from the IRMS computer which controls and monitors the resistance meter. The high voltage relays located in each fuse and relay enclosure are individually energized by the lockout relays. The fuse and relay circuit connects the resistance meter to the specific field circuit cable while the ground fault condition detection and/or measurement is taken. The lockout relay holds the fuse and relay on the selected circuit for approximately 20 seconds to allow for an accurate reading and then de-energizes. The next lockout relay will then energize and another fuse and relay enclosure will be selected. This process continues until the last circuit has been selected. The isolation process is all controlled by the IRMS computer which determines which lockout relay is energized and for what period of time.

As described above, the ground fault condition detection/measurement may be performed by a combination of two circuits. As will be appreciated from the accompanying drawings, these circuits include a megohm resistance measurement circuit and a digital controller circuit which work together to measure and record the ground fault conditions of the series circuit cable. The resistance measurement circuit imposes a 500 volt DC potential onto the airfield's series circuit while the digital controller circuitry measures the ground fault current to determine the cabling resistance. The data is then transferred to the IRMS computer.

The ground fault detection system of the present invention may be made to report cable resistance ranging from less than 20KΩ to greater than 1000MΩ. The results of the resistance measurement may then be communicated to the IRMS computer which displays the data in text or graphical format.

Figure 9:
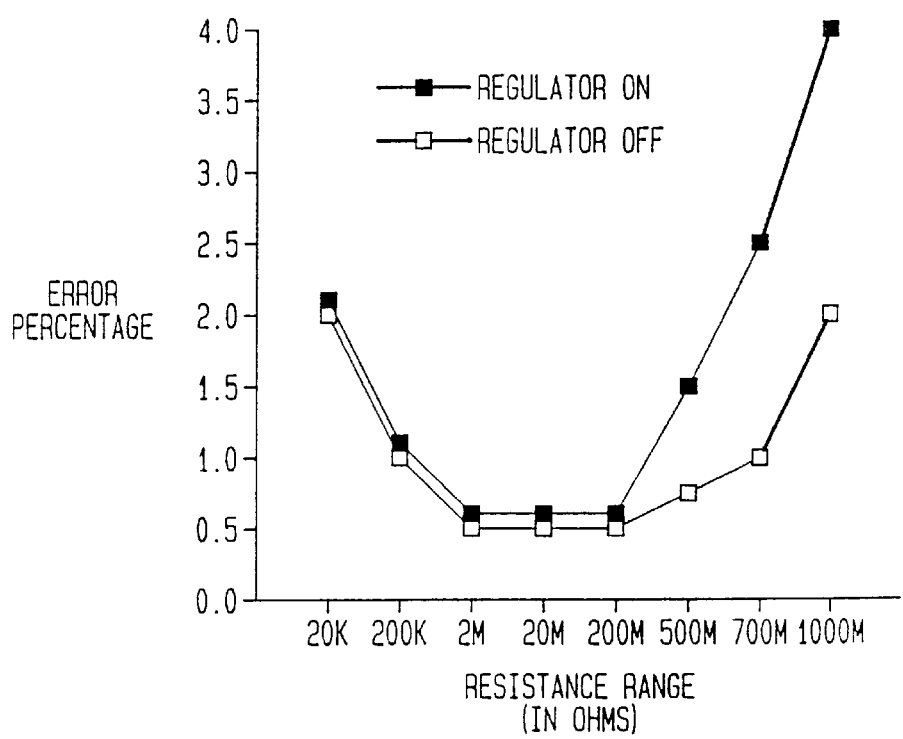
FIG. 9 is a graph that shows that resistance measurements recorded by the ground fault detection/measurement system, and shows that resistance measurements are highly accurate at both low and high ranges.

FIG. 9 shows that resistance measurements recorded by the ground fault detection/measurement system are highly accurate at both low and high ranges. The error percentage ranges from about ½% to about 4% depending on the measuring range depending on whether the circuit is operating or not. Accuracy is extremely steady on circuits that are either on or off.

Once the circuit measurement schedule has been entered the IRMS system is able to operate independent of operator control. The circuit of the present invention may also include a self-calibration circuitry which is activated each time the ground fault detection/measurement system is turned on. The system can also be made to perform self-calibrations at regular time intervals such as every half-hour. Calibration using the circuitry depicted in the accompanying drawings takes only about one minute to complete.

Figure 10A:
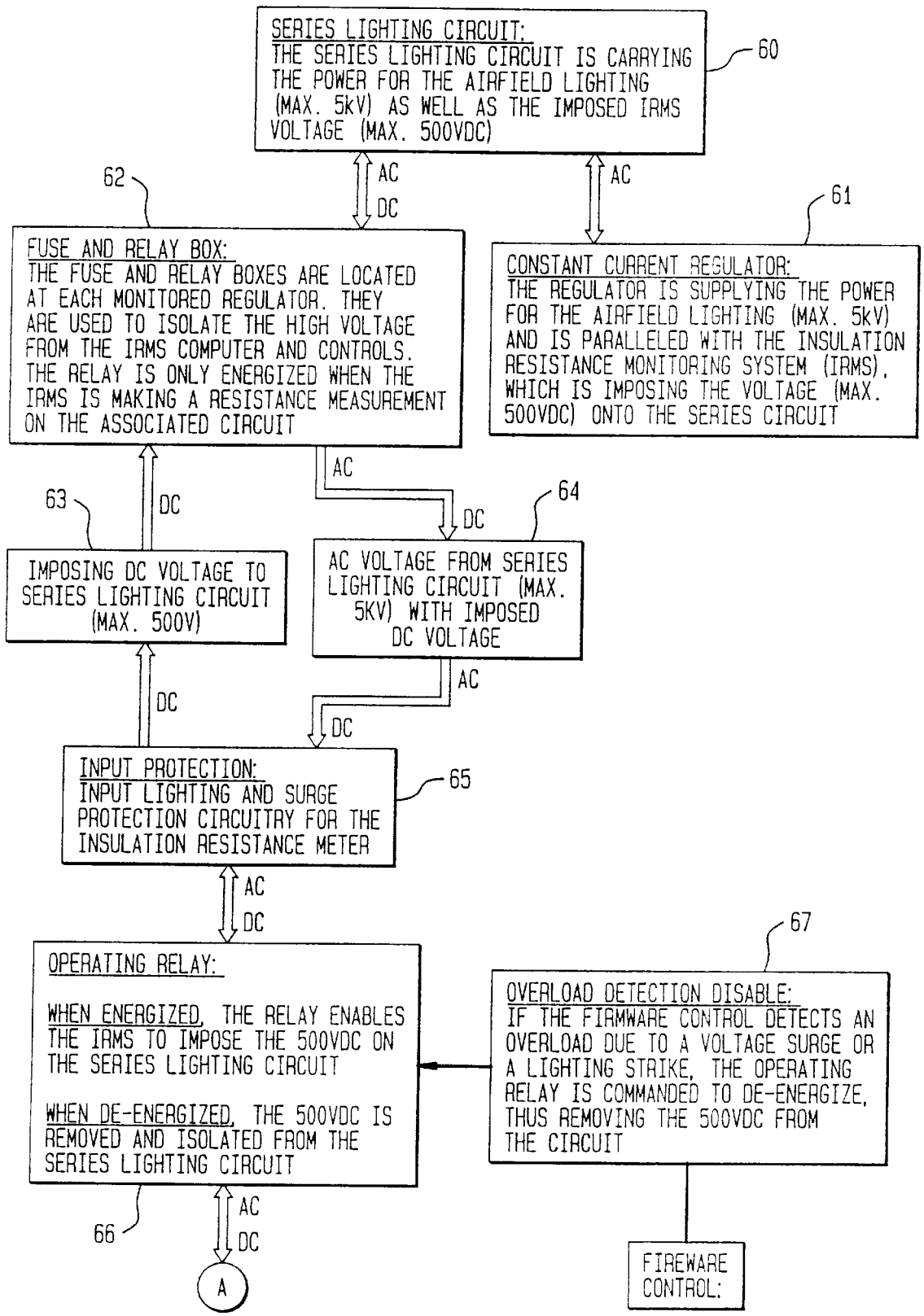

A detailed flow diagram explaining the operation of the ground fault condition detection/measurement system of the present invention is included as FIGS. 10A, 10B, comprising FIGS. 10B1 and 10B2, and 10C, comprising FIGS. 10C1 and 10C2. These Figures illustrate how the resistance meter is connected to the series circuit cable and how the resistance measurements reach the IRMS computer.

FIG. 10A comprising FIGS. 10A1 and 10A2, shows block 60 representing a series lighting circuit designed to carry power for the airfield lighting which is a maximum of 5 kV. A typical imposed DC voltage has a maximum of about 500 V. Block 61 represents a constant current regulator adapted to supply power for the airfield lighting which is paralleled with the ground fault measurement system imposing the DC voltage onto the series circuit.

Block 62 which represents the fuse and relay boxes which are located at each monitored regulator. These boxes are used to isolate the high voltage from the ground fault measurement computer and controls. The relay is only energized when the ground fault measurement system is making a ground fault measurement on the associated circuit. Block 63 and 64 represent the imposing DC voltage to the series lighting circuit and the AC voltage from the series lighting circuit with the imposed DC voltage, respectively. Block 65 represents input protection in the form of input lighting and search protection circuitry. Block 66 represents an operating relay which, when energized, enables the ground fault measurement system to impose the 500 V DC potential onto the series lighting circuit and, when de-energized, removes this potential and isolates it from the series lighting circuit. Block 67 represents a firmware control which detects an overload due to a voltage surge or a lightening strike, in which the case, the operating relay is commanded to de-energize, removing the 500 V DC potential from the circuit.

Turning to FIG. 10B comprising FIGS. 10B1 and 10B2, this shows block 68 which represents the "resistance megger" whose primary function is to eliminate any noise present on the incoming signal. Block 69 represents an overload monitor which interfaces with the overload status of the firmware control. The firmware may be adapted to initiate appropriate action depending upon the status. Block 70 represents the high voltage DC source which is designed to place a high voltage DC potential onto the series lighting circuit. This high voltage supply is totally isolated and may be driven by opto-couplers to control the voltage selecting (where more than one voltage range is used) and the on/off control. Depending upon the reading of the ground fault measurement system the power supply may be automatically switched between two voltage ranges, such as between 500 V DC and 50 V DC. The high voltage power supply also has built-in current limiting circuitry which prevents the supply from generating dangerous current levels. Block 71 represents a voltage range control which may be in the form a firmware control for selecting the voltage of the high voltage supply depending on the range of the active ground fault resistance reading. Block 72 represents self-test circuitry whereby the ground fault measurement system, once turned on, is provided with an initial test which checks the operation of the system and performs an automatic calibration.

FIG. 10B also shows block 73 which is the leakage sampler whose function it is to measure the amount of DC current leaking in a given AC circuit. The sampling circuitry may be made to function as a digital current meter to generate a DC voltage that represents the corresponding DC current that has been sampled. Depending upon the range of the ground fault condition reading, the sampler may be switched between two or more current ranges. By doing so, the ground fault measurement system of the present invention may, for example, be capable of operating in four discrete ranges:

1. Off—Ground Fault Measurement System Disabled
2. Low Ohm Range—Readings from 20–200 kΩ
3. Medium Ohm Range—Readings from 200 kΩ–2MΩ
4. High Ohm Range—Readings above 2MΩ

Block 74 represents a current range control which may be in the form of a firmware control for selecting the current ranges of the ground fault measurement sampler depending on the range of the active ground fault reading. Block 75 represents the firmware control itself which maintains the operation of the ground fault measurement system. The firmware control's task may include: (1) providing the analog to digital converter its control parameters for selective sampling, (2) controlling voltage and current ranges, (3) initiating the ground fault measurement test mode, (4) monitoring the system for overload, (5) disabling the system upon detection of overload, and (6) performing commands requested by the computer.

FIG. 10C, comprising FIGS. 10C1 and 10C2, shows block 76 which represents an analog to digital converter which may be a 16-bit converter to selectively sample the DC voltage generated by the ground fault resistance sampler. The A-D converter may also be responsible for determining the range control parameters and may report the necessary measurement range to the firmware control which in turn makes appropriate adjustments to the high voltage supply or to the ground fault sampler. Block 77 represents the selective sampling parameters which may be generated by the firmware control and which are used by the analog to digital converter to determine, for instance, when and how often to take sample measurements. Block 78 represents a range selector whereby the analog to digital converter may signal the firmware control when a measurement is out of a given range. The firmware control then may make appropriate adjustments to the high voltage supply and the ground fault sampler. Also shown is block 79 which represents a parallel to serial converter which may be provided by a 7-bit addressable UART. This converter changes the format of the information so it may be transferred to the system computer. When addressed, the UART may convert the 16-bit parallel number into 8-bit serial numbers. This process may be reversed when commands from the system computer are given.

Block 80 represents range update information flowing from the firmware control to update the computer on the current operating range of the ground fault measurement system.

Block 81 represents serial port communication, such as via an RS232 port. All serial date is transferred between the ground fault measurement circuitry and the system computer by an RS232 line transceiver. The data transfer may take place across a 9-pin connector which interfaces to the computer's serial port The IRMS computer interfaces directly to the visual controller board through its serial port and is responsible for controlling the scheduling and recording of the insulation resistance measurements.

The computer may be an industrially hardened AT compatible computer with a passive backplane. Also within the computer is a interface board (such as an ET-100 board commercially available from Siemens Corporation of Iselin, N.J.) which is used for serial communications to the I-O modular system. The input/output system is used to control the lockout relays which individually select which circuit is to be measured.

From the computer keyboard, an operator can enable or disable the IRMS operation, specify which circuits which should be monitored and at what time, and review or printout previously collected data. The collected data can be displayed on the computer monitor or printed to the printer in a text or graphical format which is automatically stored on the computer's hard drive.

Figure 11:
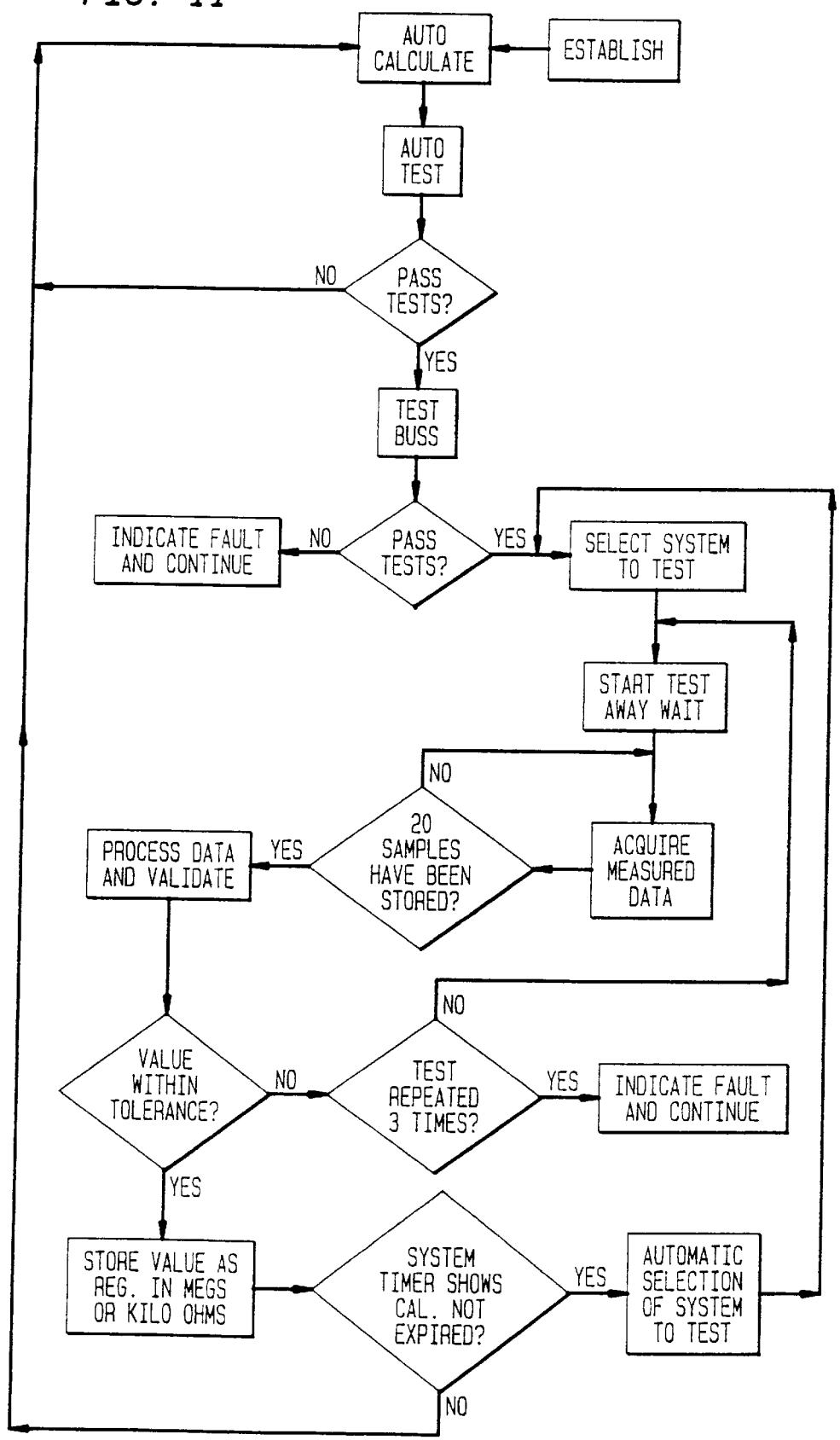
FIG. 11 shows a basic logic diagram from which the microprocessor operating instructions can be written in accordance with one embodiment of the present invention.

FIG. 11 shows a basic logic diagram from which the microprocessor operating instructions can be written in accordance with one embodiment of the present invention.

The performance of the system described in the foregoing preferred embodiment was found to give high signal-to-noise ratio for the DC signal compared to the AC signal. The results were stable at very low leakage levels. The initial tolerance of the measurements in the extended ranges of about 1 gigaohm was about ±1%. Furthermore, measurements were found to be practical at resistance levels of as much as 10 gigaohms.

Performance at this level could be achieved regardless whether the system was energized or not. This allows the operator to take measurements under energized and non-energized conditions, and to compare the performance of the circuit under both such conditions.

In view of the foregoing disclosure and/or from practice of the present invention, it will be within the ability of one skilled in the art to make alterations to the method and apparatus of the present invention, such as through the substitution of equivalent elements or process steps, to be able to practice the invention without departing from its scope as reflected in the appended claims.

What is claimed is:

1. A method for substantially separating the DC component from the AC component of a composite AC/DC waveform in an airfield lighting or control system, said method comprising the steps of:

a. obtaining an electrical connection to a composite AC/DC waveform;

b. conducting said AC/DC waveform through an inductive device comprising:

i. an inductor coil having an input pole, an output pole and a capacitor connected to said output pole so as to load said inductor coil;

ii. a driver winding for said inductor coil, said driver winding adapted to sense AC current flow through said inductor coil;

iii. a sampling element connected to said driver winding and adapted to detect said AC current in the form of a voltage across said sampling element;

iv. signal processing circuitry comprising:

(1) an inverting amplifier adapted to amplify said voltage; and (2) a phase shifter adapted to shift the phase of said voltage;

v. a power amplifier coupled to said signal processing circuitry and also coupled to the other of said driver winding; and c. measuring the DC component of said AC/DC composite waveform through said output pole of said inductor coil.

2. A method for detecting a ground fault condition in an active AC circuit of an airfield lighting or control system, said method comprising the steps of:

a. obtaining a circuit having an active AC waveform therein;

b. superimposing upon said AC waveform a DC voltage, said DC voltage produced by a DC voltage source, whereby a composite AC/DC waveform is produced;

c. separating said DC voltage from said composite AC/DC waveform; and d. directly measuring current flowing through said DC voltage source whereby the existence of a ground fault condition in said circuit is determined directly.

3. A method for detecting a ground fault condition in an active AC circuit, said method comprising the steps of:

a. obtaining a circuit having an active AC waveform therein;

b. superimposing upon said AC waveform a DC voltage, said DC voltage produced by a DC voltage source, whereby a composite AC/DC waveform is produced;

c. separating said DC voltage from said composite AC/DC waveform using an inductive device comprising:

i. an inductor coil having an input pole and an output pole, said inductive coil having a capacitor connected to said output pole so as to load said inductive coil;

ii. a driver winding for said inductor coil, said driver winding adapted to sense AC current flow through said inductor coil;

iii. a sampling element connected to said driver winding and adapted to detect said AC current; and iv. signal processing circuitry adapted to measure the DC component of said AC/DC composite waveform through said output pole of said inductor coil d. measuring current flowing through said DC voltage source whereby the existence of a ground fault condition in said circuit may be determined.

4. A method according to claims 1, 2 or 3, wherein said inductive device additionally comprises a corrective feedback device that is coupled to said signal processing circuitry and to said DC current measuring device, whereby a resultant voltage is obtained from a corrective feedback voltage across said corrective feedback device and from said voltage across said sampling element and applied to said signal processing circuitry whereby DC bias occurring in said inductor coil is compensated.

5. A method according to claims 1, 2 or 3, wherein said sampling element of said inductive device comprises at least one sampling resistor.

6. A method for substantially separating the DC component from the AC component of a composite AC/DC waveform, said method comprising the steps of:
 a. obtaining an electrical connection to a composite AC/DC waveform;
 b. conducting said AC/DC waveform through an inductive device comprising:
  i. an inductor coil means having an input pole, an output pole, and a capacitor connected to said output pole for loading said inductor coil, wherein said inductor coil comprises a driver winding means for sensing AC current flow through said inductor coil means;
  ii. a sampling element for connecting to said driver winding means and for detecting said AC current in the form of a voltage across said sampling element;
  iii. signal processing means comprising an inverting amplifier means for amplifying said voltage and a phase shifter means for shifting the phase of said voltage;
  iv. a power amplifier means coupled to said signal processing means and also coupled to the other of said driver winding means; and
 c. measuring the DC component of said AC/DC composite waveform through said output pole of said inductor coil means.

7. A method for detecting a ground fault condition in an active AC circuit, said method comprising the steps of:
 a. obtaining a circuit having an active AC waveform therein;
 b. superimposing upon said AC waveform a DC voltage, said DC voltage produced by a DC voltage source, whereby a composite AC/DC waveform is produced;
 c. separating said DC voltage from said composite AC/DC waveform using an inductive device comprising:
  i. an inductor coil means having an input pole, an output pole, and a capacitor connected to said output pole for loading said inductor coil means;
  ii. said inductor coil means comprising a driver winding means for sensing AC current flow through said inductor coil means;
  iii. a sampling element means connected to said driver winding means for detecting said AC current in the form of a voltage across said sampling element; and
  iv. signal processing means for measuring the DC component of said AC/DC composite waveform through said output pole of said inductor coil means
 d. Measuring current flowing through said DC voltage source whereby the existence of a ground fault condition in said circuit may be determined.

8. A method according to claims 6 or 7, wherein said inductive device additionally comprises a corrective feedback means that is coupled to said signal processing means and to said DC current measuring means, whereby a resultant voltage is obtained from a corrective feedback voltage across said corrective feedback means and from said voltage across said sampling element means and applied to said signal processing means whereby DC bias occurring in said inductor coil is compensated.

9. A method according to claims 6 or 7, wherein said sampling element means of said inductive device comprises at least one sampling resistor.

10. A method according to claim 4, wherein said sampling element of said induction device comprises at least one sampling resistor.

* * * * *